(12) United States Patent
Wang et al.

(10) Patent No.: US 11,462,503 B2
(45) Date of Patent: Oct. 4, 2022

(54) HYBRID BONDING USING DUMMY BONDING CONTACTS

(71) Applicant: YANGTZE MEMORY TECHNOLOGIES CO., LTD., Wuhan (CN)

(72) Inventors: Tao Wang, Wuhan (CN); Si Ping Hu, Wuhan (CN); Jia Wen Wang, Wuhan (CN); Shi Qi Huang, Wuhan (CN); Jifeng Zhu, Wuhan (CN); Jun Chen, Wuhan (CN); Zi Qun Hua, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 178 days.

(21) Appl. No.: 17/064,494

(22) Filed: Oct. 6, 2020

(65) Prior Publication Data

US 2021/0035941 A1 Feb. 4, 2021

Related U.S. Application Data

(60) Division of application No. 16/292,277, filed on Mar. 4, 2019, now Pat. No. 11,049,834, which is a
(Continued)

(51) Int. Cl.
*H01L 23/52* (2006.01)
*H01L 23/00* (2006.01)
(Continued)

(52) U.S. Cl.
CPC ........ *H01L 24/32* (2013.01); *H01L 21/76895* (2013.01); *H01L 23/528* (2013.01);
(Continued)

(58) Field of Classification Search
CPC . H01L 21/76895; H01L 23/528; H01L 24/83; H01L 24/03; H01L 24/06;
(Continued)

(56) References Cited

U.S. PATENT DOCUMENTS

| 9,142,587 B2 | 9/2015 | Kobayashi |
| 9,558,945 B2 | 1/2017 | Fukuzumi |

(Continued)

FOREIGN PATENT DOCUMENTS

| CN | 1499624 A | 5/2005 |
| CN | 101000880 A | 7/2007 |

(Continued)

OTHER PUBLICATIONS

International Search Report issued in corresponding International Application No. PCT/CN2019/073832, dated Jul. 29, 2019, 5 pages.
(Continued)

*Primary Examiner* — Luan C Thai
(74) *Attorney, Agent, or Firm* — Bayes PLLC

(57) ABSTRACT

Embodiments of bonded semiconductor structures and fabrication methods thereof are disclosed. In an example, a method for forming a semiconductor device is disclosed. A first interconnect layer including first interconnects is formed above a first substrate. A first bonding layer including first bonding contacts is formed above the first interconnect layer, such that each first interconnect is in contact with a respective first bonding contact. A second interconnect layer including second interconnects is formed above a second substrate. A second bonding layer including second bonding contacts is formed above the second interconnect layer, such that at least one second bonding contact is in contact with a respective second interconnect, and at least another second bonding contact is separated from the second interconnects. The first and second substrates are bonded in
(Continued)

a face-to-face manner, such that each first bonding contact is in contact with one second bonding contact at a bonding interface.

10 Claims, 10 Drawing Sheets

Related U.S. Application Data continuation of application No. PCT/CN2019/073832, filed on Jan. 30, 2019.

(51) Int. Cl.
| | |
|---|---|
| *H01L 27/11568* | (2017.01) |
| *H01L 21/768* | (2006.01) |
| *H01L 25/00* | (2006.01) |
| *H01L 27/11573* | (2017.01) |
| *H01L 25/18* | (2006.01) |
| *H01L 27/11582* | (2017.01) |
| *H01L 23/528* | (2006.01) |

(52) U.S. Cl.
CPC .............. *H01L 24/03* (2013.01); *H01L 24/06* (2013.01); *H01L 24/08* (2013.01); *H01L 24/27* (2013.01); *H01L 24/83* (2013.01); *H01L 25/18* (2013.01); *H01L 25/50* (2013.01); *H01L 27/11568* (2013.01); *H01L 27/11573* (2013.01); *H01L 27/11582* (2013.01); *H01L 2224/0362* (2013.01); *H01L 2224/03616* (2013.01); *H01L 2224/05647* (2013.01); *H01L 2224/06515* (2013.01); *H01L 2224/08145* (2013.01); *H01L 2224/32145* (2013.01); *H01L 2224/80895* (2013.01); *H01L 2224/80896* (2013.01); *H01L 2224/83895* (2013.01); *H01L 2224/83896* (2013.01); *H01L 2924/14511* (2013.01)

(58) Field of Classification Search
CPC ......... H01L 24/08; H01L 24/27; H01L 25/50; H01L 25/18; H01L 27/11573; H01L 27/11582; H01L 27/11586; H01L 2224/32145
USPC .......................................................... 257/773
See application file for complete search history.

(56) References Cited

U.S. PATENT DOCUMENTS

| | | | |
|---|---|---|---|
| 9,583,465 | B1 * | 2/2017 | Cheng ................. H01L 25/0657 |
| 9,613,881 | B2 | 4/2017 | Ahn et al. |
| 9,780,136 | B2 | 10/2017 | Kwon |
| 9,960,142 | B2 * | 5/2018 | Chen ................... H01L 23/5226 |
| 10,026,769 | B2 | 7/2018 | Kagawa |
| 10,141,391 | B2 | 11/2018 | Kang |
| 10,147,732 | B1 | 12/2018 | Hu et al. |
| 10,297,578 | B2 | 5/2019 | Tagami |
| 2016/0086869 | A1 | 3/2016 | Ahn et al. |
| 2016/0211248 | A1 | 7/2016 | Yaung et al. |
| 2018/0204868 | A1 | 7/2018 | Kai et al. |
| 2018/0240859 | A1 | 8/2018 | Yang |

FOREIGN PATENT DOCUMENTS

| | | |
|---|---|---|
| CN | 104779238 A | 7/2015 |
| CN | 104952747 A | 9/2015 |
| CN | 105390467 A | 3/2016 |
| CN | 105431938 A | 3/2016 |
| CN | 107615481 A | 1/2018 |
| CN | 107731667 A | 2/2018 |
| CN | 109155301 A | 1/2019 |
| CN | 109219885 A | 1/2019 |
| TW | 1242249 B | 6/2005 |
| TW | 201021187 A | 6/2010 |
| TW | 201304063 A | 1/2013 |
| TW | I492333 B | 7/2015 |
| TW | 201530698 A | 8/2015 |
| TW | 201535660 A | 9/2015 |
| TW | 201539725 Z | 10/2015 |
| TW | I563638 B | 12/2016 |
| TW | 201732974 A | 9/2017 |
| TW | 201803092 A | 1/2018 |

OTHER PUBLICATIONS

Written Opinion of the International Searching Authority issued in corresponding International Application No. PCT/CN2019/073832, dated Jul. 29, 2019, 4 pages.
International Search Report issued in corresponding International Application No. PCT/CN2019/073909, dated Nov. 5, 2019, 4 pages.
Written Opinion of the International Searching Authority issued in corresponding International Application No. PCT/CN2019/073909, dated Nov. 5, 2019, 4 pages.

* cited by examiner

HYBRID BONDING USING DUMMY BONDING CONTACTS

CROSS REFERENCE TO RELATED APPLICATIONS

This application is divisional of U.S. application Ser. No. 16/292,277, filed on Mar. 4, 2019, entitled "HYBRID BONDING USING DUMMY BONDING CONTACTS," which is continuation of International Application No. PCT/CN2019/073832, filed on Jan. 30, 2019, entitled "HYBRID BONDING USING DUMMY BONDING CONTACTS," both of which are hereby incorporated by reference in their entireties. This application is also related to U.S. application Ser. No. 16/292,279, filed on Mar. 4, 2019, entitled "HYBRID BONDING USING DUMMY BONDING CONTACTS AND DUMMY INTERCONNECTS," which is hereby incorporated by reference in its entirety.

BACKGROUND

Embodiments of the present disclosure relate to bonded semiconductor structures and fabrication methods thereof.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, Flash memory devices.

A 3D semiconductor device can be formed by stacking semiconductor wafers or dies and interconnecting them vertically using, for instance, through-silicon vias (TSVs) or copper-to-copper (Cu—Cu) connections, so that the resulting structure acts as a single device to achieve performance improvements at reduced power and smaller footprint than conventional planar processes. Among the various techniques for stacking semiconductor substrates, hybrid bonding is recognized as one of the promising techniques because of its capability of forming high-density interconnects.

SUMMARY

Embodiments of semiconductor devices, bonded structures, and fabrication methods thereof are disclosed herein.

In one example, a semiconductor device includes a first semiconductor structure and a second semiconductor structure. The first semiconductor structure includes a first interconnect layer including a plurality of first interconnects. The first semiconductor structure further includes a first bonding layer including a plurality of first bonding contacts. Each of the first interconnects is in contact with a respective one of the first bonding contacts. The second semiconductor structure includes a second interconnect layer including a plurality of second interconnects. The second semiconductor structure further includes a second bonding layer including a plurality of second bonding contacts. At least one of the second bonding contacts is in contact with a respective one of the second interconnects. At least another one of the second bonding contacts is separated from the second interconnects. The semiconductor device further includes a bonding interface between the first bonding layer and the second bonding layer. Each of the first bonding contacts is in contact with one of the second bonding contacts at the bonding interface.

In another example, a bonded structure includes a bonding interface, a pair of functional bonding contacts, and a pair of dummy bonding contacts. The pair of functional bonding contacts are in contact with one another at the bonding interface. The pair of functional bonding contacts are in contact with a pair of interconnects on opposite sides of the bonding interface, respectively. The pair of dummy bonding contacts are in contact with one another at the bonding interface. The pair of dummy bonding contacts are in contact with an interconnect on one side of the bonding interface and separated from any interconnect on the opposite side of the bonding interface.

In still another example, a method for forming a semiconductor device is disclosed. A first interconnect layer including a plurality of first interconnects is formed above a first substrate. A first bonding layer including a plurality of first bonding contacts is formed above the first interconnect layer, such that each of the first interconnects is in contact with a respective one of the first bonding contacts. A second interconnect layer including a plurality of second interconnects is formed above a second substrate. A second bonding layer including a plurality of second bonding contacts is formed above the second interconnect layer, such that at least one of the second bonding contacts is in contact with a respective one of the second interconnects, and at least another one of the second bonding contacts is separated from the second interconnects. The first substrate and the second substrate are bonded in a face-to-face manner, such that each of the first bonding contacts is in contact with one of the second bonding contacts at a bonding interface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
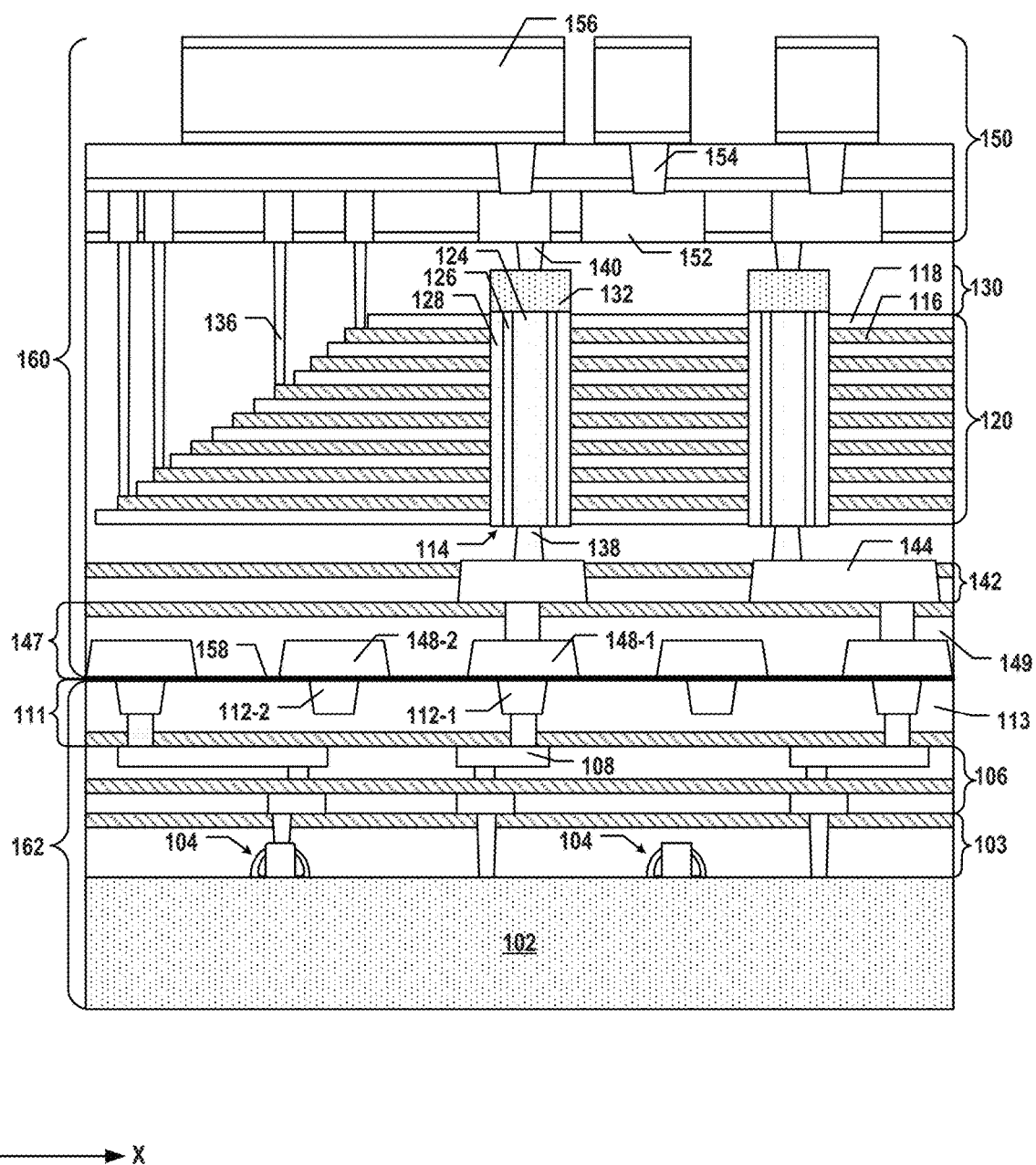
FIG. 1 illustrates a cross-section of an exemplary bonded semiconductor device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In a high density, low feature size (e.g., below 0.5 µm) hybrid bonding process, in order to increase the bonding yield, the bonding contacts on opposite sides of the bonding interface are often made by two dual damascene processes each involving two patterning processes (e.g., two photolithography and development processes). To reduce the high cost of using four patterning processes, fabrication processes involving only three or even two patterning processes have been proposed to make the bonding contacts. However, known processes cannot form dummy bonding contacts at the bonding interface to achieve desired uniformity of metal and dielectric distribution at the bonding interface, thereby decreasing the bonding yield and strength. For example, the variation of metal local density can cause the nonuniformity of erosion control and dishing control during the subsequent chemical mechanical polishing (CMP) process. Also, the lack of dummy bonding contacts can cause a large number of metal-dielectric bonding and dielectric-dielectric bonding regions, which have lower bonding strengths than metal-metal bonding regions.

Various embodiments in accordance with the present disclosure provide hybrid bonding using dummy bonding contacts for improving bonding yield and strength. The dummy bonding contacts and functional bonding contacts on at least one side of the bonding interface can be made in a single patterning process, thereby reducing the process cost. In some embodiments, the local density of the bonding contacts can be controlled by adding the dummy bonding contacts based on the design of the interconnects in the lower layer to increase the bonding yield and strength. In some embodiments, the dummy bonding contacts and functional bonding contacts on each side of the bonding interface are made in a single patterning process, thereby further reducing the cost of the hybrid bonding process. Dummy interconnects can be added into the interconnect layer to enable adding additional dummy bonding contacts in the upper layer in a single patterning process without affecting the electrical connections in the bonded device.

FIG. 1 illustrates a cross-section of an exemplary bonded semiconductor device 100, according to some embodiments of the present disclosure. For ease of description, bonded semiconductor device 100 will be described as a non-monolithic 3D memory device. However, it is understood that bonded semiconductor device 100 is not limited to a 3D memory device and can include any suitable bonded semiconductor devices that can use dummy bonding contacts to improve bonding interface properties as described below in detail. It is understood that bonded semiconductor devices that include dummy bonding contacts at its bonding interface as disclosed herein are not limited to the examples shown in FIG. 1 and can include any other suitable semiconductor devices, such as logic devices, volatile memory devices (e.g., dynamic random-access memory (DRAM) and static random-access memory (SRAM)), and non-volatile memory devices (e.g., Flash memory), in a 2D, 2.5D, or 3D architecture.

Bonded semiconductor device 100 represents an example of a non-monolithic 3D memory device. The term "non-monolithic" means that the components of bonded semiconductor device 100 (e.g., peripheral devices and memory array devices) can be formed separately on different substrates and then bonded to form a bonded semiconductor device. Bonded semiconductor device 100 can include a substrate 102, which can include silicon (e.g., single crystalline silicon), silicon germanium (SiGe), gallium arsenide (GaAs), germanium (Ge), silicon on insulator (SOI), or any other suitable materials.

It is noted that x and y axes are included in FIG. 1 to further illustrate the spatial relationship of the components in bonded semiconductor device 100 having substrate 102. Substrate 102 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., bonded semiconductor device 100) is determined relative to the substrate of the semiconductor device (e.g., substrate 102) in the y-direction (i.e., the vertical direction) when the substrate is positioned in the lowest plane of the semiconductor device in the y-direction. The same notion for describing spatial relationship is applied throughout the present disclosure.

Bonded semiconductor device 100 can include two semiconductor structures, i.e., a memory array device chip 160 and a peripheral device chip 162 bonded in a face-to-face manner at a bonding interface 158. In some embodiments, bonding interface 158 is disposed between memory array device chip 160 and peripheral device chip 162 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 158 is the place at which memory array device chip 160 and peripheral device chip 162 are met and bonded. In practice, bonding interface 158 can be a layer with a certain thickness that includes the bottom surface of memory array device chip 160 and the bottom surface of peripheral device chip 162. It is understood that although memory array device chip 160 is disposed above peripheral device chip 162 in FIG. 1, their relative positions can be reversed in some embodiments. For example, memory array device chip 160 can be disposed below peripheral device chip 162 in another bonded semiconductor device.

Peripheral device chip 162 can include a peripheral device layer 103 on substrate 102. Peripheral device layer 103 can include a peripheral device (e.g., a plurality of transistors 104) formed on substrate 102. Transistors 104 can be formed "on" substrate 102, where the entirety or part of each transistor 104 is formed in substrate 102 (e.g., below the top surface of substrate 102) and/or directly on substrate 102. Isolation regions (e.g., shallow trench isolations (STIs), not shown) and doped regions (e.g., source regions and drain regions of transistors 104, not shown) can be formed in substrate 102.

In some embodiments, the peripheral device of peripheral device layer 103 can include any suitable digital, analog, and/or mixed-signal peripheral circuits used for facilitating the operation of bonded semiconductor device 100. For example, the peripheral device of peripheral device layer 103 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device of peripheral device layer 103 is formed on substrate 102 using complementary metal-oxide-semiconductor (CMOS) technology (also known as a "CMOS chip").

Peripheral device chip 162 can include an interconnect layer 106 (referred to herein as a "peripheral interconnect layer") above peripheral device layer 103 to transfer electrical signals to and from peripheral device layer 103. Peripheral interconnect layer 106 can include a plurality of interconnects 108 (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. As described below in detail, interconnects 108 in peripheral interconnect layer 106 can include functional interconnects that are electrically connected to the peripheral device and optionally, further include dummy interconnects that are not electrically connected to any peripheral device in peripheral device layer 103. Peripheral interconnect layer 106 can further include one or more interlayer dielectric (ILD) layers (also known as "intermetal dielectric (IMD) layers") in which the interconnect lines and via contacts can form. That is, peripheral interconnect layer 106 can include interconnects 108 in multiple ILD layers. Interconnects 108 in peripheral interconnect layer 106 can include conductive materials including, but not limited to, tungsten (W), cobalt (Co), copper (Cu), aluminum (Al), silicides, or any combination thereof. The ILD layers in peripheral interconnect layer 106 can include dielectric materials including, but not limited to, silicon oxide, silicon nitride, silicon oxynitride, low dielectric constant (low-k) dielectrics, or any combination thereof.

As shown in FIG. 1, peripheral device chip 162 can further include a bonding layer 111 at bonding interface 158 and above peripheral interconnect layer 106 and peripheral device layer 103. Bonding layer 111 can include a plurality of bonding contacts 112 and a dielectric 113 electrically isolating bonding contacts 112. Bonding contacts 112 can include functional bonding contacts 112-1, each of which is part of an electrical connection between peripheral device chip 162 and memory array device chip 160. Bonding contacts 112 can also include dummy bonding contacts 112-2, each of which is not part of any electrical connection between peripheral device chip 162 and memory array device chip 160. As described below in detail, dummy bonding contacts 112-2 can be used for increasing the local density of bonding contacts 112 at bonding interface 158 to increase bonding yield and strength. Bonding contacts 112 can include conductive materials including, but not limited to, W, Co, Cu, Al, silicides, or any combination thereof. The remaining area of bonding layer 111 can be formed with dielectric 113 including, but not limited to, silicon oxide, silicon nitride, silicon oxynitride, low-k dielectrics, or any combination thereof. Bonding contacts 112 and dielectric 113 in bonding layer 111 can be used for hybrid bonding as described below in detail.

In some embodiments, memory array device chip 160 is a NAND Flash memory device in which memory cells are provided in the form of an array of NAND memory strings 114 each extending vertically above peripheral device layer 103. Memory array device layer 120 can include NAND memory strings 114 that extend vertically through a plurality of pairs each including a conductor layer 116 and a dielectric layer 118 (referred to herein as "conductor/dielectric layer pairs"). The stacked conductor/dielectric layer pairs are also referred to herein as a "memory stack." Conductor layers 116 and dielectric layers 118 in the memory can stack alternately in the vertical direction.

As shown in FIG. 1, each NAND memory string 114 can include a semiconductor channel 124 and a dielectric layer (also known as a "memory film"). In some embodiments, semiconductor channel 124 includes silicon, such as amorphous silicon, polysilicon, or single crystalline silicon. In some embodiments, the memory film is a composite layer including a tunneling layer 126, a storage layer 128 (also known as a "charge trap/storage layer"), and a blocking layer (not shown). Each NAND memory string 114 can have a cylinder shape (e.g., a pillar shape). Semiconductor channel 124, tunneling layer 126, storage layer 128, and the blocking layer are arranged radially from the center toward the outer surface of the pillar in this order, according to some embodiments. Tunneling layer 126 can include silicon oxide, silicon oxynitride, or any combination thereof. Storage layer 128 can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 114 further include a plurality of control gates (each being part of a word line). Each conductor layer 116 in the memory stack can act as a control gate for memory cell of each NAND memory string 114. Each NAND memory string 114 can include a source select gate at its upper end and a drain select gate at its lower end. As used herein, the "upper end" of a component (e.g., NAND memory string 114) is the end farther away from substrate 102 in the y-direction, and the "lower end" of the component (e.g., NAND memory string 114) is the end closer to substrate 102 in the y-direction.

In some embodiments, memory array device chip 160 further includes a semiconductor layer 130 disposed above and in contact with NAND memory strings 114. Memory array device layer 120 can be disposed below semiconductor layer 130. In some embodiments, semiconductor layer 130 includes a plurality of semiconductor plugs 132 electrically separated by isolation regions. In some embodiments, each semiconductor plug 132 is disposed at the upper end of corresponding NAND memory string 114 and functions as the drain of corresponding NAND memory string 114 and thus, can be considered as part of corresponding NAND memory string 114. Semiconductor plug 132 can include a single crystalline silicon. Semiconductor plug 132 can be un-doped, partially doped (in the thickness direction and/or the width direction), or fully doped by p-type or n-type dopants.

In some embodiments, memory array device chip 160 includes local interconnects that are formed in one or more ILD layers and in contact with components in memory array device layer 120, such as the word lines (e.g., conductor layers 116) and NAND memory strings 114. The local interconnects can include word line via contacts 136, source line via contacts 138, and bit line via contacts 140. Each local interconnect can include conductive materials including, but not limited to, W, Co, Cu, Al, silicides, or any combination thereof. Word line via contacts 136 can extend vertically through one or more ILD layers. Each word line via contact 136 can be in contact with corresponding conductor layer 116 to individually address a corresponding word line of bonded semiconductor device 100. Each source line via contact 138 can be in contact with the source of corresponding NAND memory string 114. Bit line via contacts 140 can extend vertically through one or more ILD layers. Each bit line via contact 140 can electrically connect to corresponding semiconductor plug 132 (e.g., the drain) of NAND memory string 114 to individually address corresponding NAND memory string 114.

Similar to peripheral device chip 162, memory array device chip 160 can also include interconnect layers for transferring electrical signals to and from NAND memory strings 114. As shown in FIG. 1, memory array device chip 160 can include an interconnect layer 142 (referred to herein as an "array interconnect layer") below memory array device layer 120. Array interconnect layer 142 can include a plurality of interconnects 144, including interconnect lines and via contacts in one or more ILD layers. As described below in detail, interconnects 144 in array interconnect layer 142 can include functional interconnects that are electrically connected to NAND memory string 114 and optionally, further include dummy interconnects that are not electrically connected to any NAND memory string 114 in memory array device layer 120.

As shown in FIG. 1, memory array device chip 160 can further include a bonding layer 147 at bonding interface 158 and below array interconnect layer 142 and memory array device layer 120. Bonding layer 147 can include a plurality of bonding contacts 148 and a dielectric 149 electrically isolating bonding contacts 148. Bonding contacts 148 can include functional bonding contacts 148-1, each of which is part of an electrical connection between peripheral device chip 162 and memory array device chip 160. Bonding contacts 148 can also include dummy bonding contacts 148-2, each of which is not part of any electrical connection between peripheral device chip 162 and memory array device chip 160. As described below in detail, dummy bonding contacts 148-2 can be used for increasing the local density of bonding contacts 148 at bonding interface 158 to increase bonding yield and strength. Bonding contacts 148 can include conductive materials including, but not limited to, W, Co, Cu, Al, silicides, or any combination thereof. The remaining area of bonding layer 147 can be formed with dielectric 149 including, but not limited to, silicon oxide, silicon nitride, silicon oxynitride, low-k dielectrics, or any combination thereof. Bonding contacts 148 and dielectric 149 in bonding layer 147 can be used for hybrid bonding as described below in detail.

As shown in FIG. 1, another interconnect layer 150 (referred to herein as a "BEOL interconnect layer") can be disposed above memory array device layer 120 and can include interconnects, such as interconnect lines 152 and via contacts 154 in one or more ILD layers. BEOL interconnect layer 150 can further include contact pads 156 and a redistribution layer (not shown) at the top portion of bonded semiconductor device 100 for wire bonding and/or bonding with an interposer. BEOL interconnect layer 150 and array interconnect layer 142 can be formed on opposite sides of memory array device layer 120. In some embodiments, interconnect lines 152, via contacts 154, and contact pads 156 in BEOL interconnect layer 150 can transfer electrical signals between bonded semiconductor device 100 and external circuits.

As shown in FIG. 1, bonding interface 158 can be formed between bonding layers 111 and 147. Bonding contacts 112 are in contact with bonding contacts 148 at bonding interface 158, and dielectric 113 is in contact with dielectric 149, according to some embodiments. In some embodiments, a pair of functional bonding contacts 112-1 and 148-1 are in contact with one another at bonding interface 158, and pair of functional bonding contacts 112-1 and 148-1 are in contact with a pair of interconnects 108 and 144 on opposite sides of bonding interface 158, respectively. In some embodiments, a pair of dummy bonding contacts 112-2 and 148-2 are in contact with one another at bonding interface 158 as well. As dummy bonding contacts for improving metal density and uniformity at bonding interface 158 for hybrid bonding, dummy bonding contacts 112-2 and 148-2 in pair are separated from the functional interconnects on at least one side of bonding interface 158 (e.g., in peripheral interconnect layer 106 and/or array interconnect layer 142) to avoid forming an electrical connection between memory array device chip 160 and peripheral device chip 162. In some embodiments, peripheral interconnect layer 106 and array interconnect layer 142 include a pair of dummy interconnects that are not electrically connected to NAND memory strings 114 and transistors 104, and pair of dummy bonding contacts 112-2 and 148-2 can be in contact with the pair of dummy interconnects on the opposite sides of bonding interface 158, respectively, without forming an electrical connection between memory array device chip 160 and peripheral device chip 162. In some embodiments, a pair of dielectrics 113 and 149 are in contact with one another at bonding interface 158 as well.

Figure 2A:
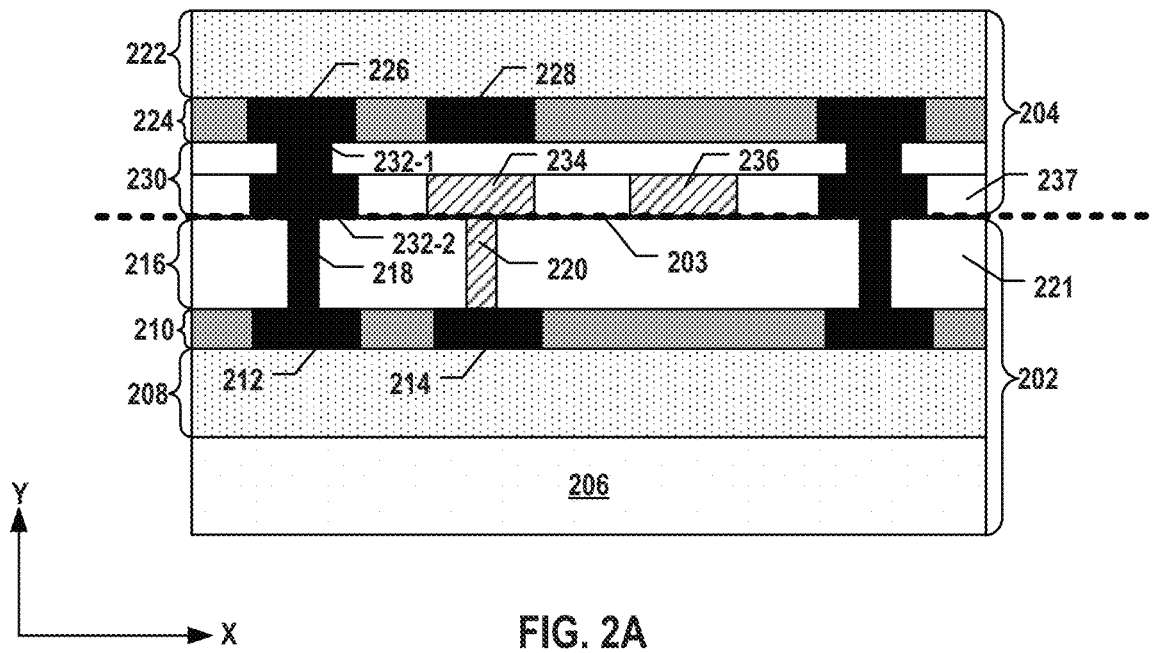
FIGS. 2A and 2B illustrate cross-sections of various exemplary bonded semiconductor devices including dummy bonding contacts, according to various embodiments of the present disclosure.
Figure 2B:
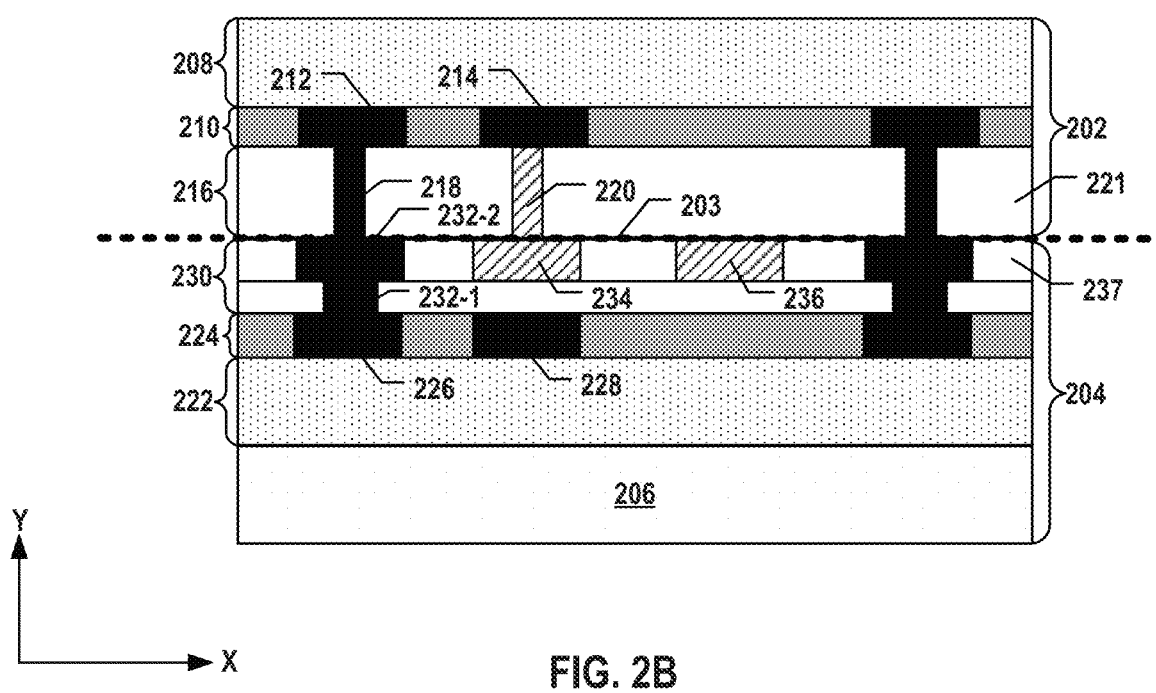

FIGS. 2A and 2B illustrate cross-sections of various exemplary bonded semiconductor devices including dummy bonding contacts, according to various embodiments of the present disclosure. FIG. 2A illustrates a bonded structure 200 including a first semiconductor structure 202 and a second semiconductor structure 204, according to some embodiments. As shown in FIG. 2A, first semiconductor structure 202 is disposed below second semiconductor structure 204 in bonded structure 200 and includes a substrate 206, according to some embodiments. First semiconductor structure 202 can also include a first device layer 208 above substrate 206. In some embodiments, first semiconductor structure 202 is a peripheral device chip or a memory array device chip, and first device layer 208 includes a peripheral device or a NAND memory string, respectively, as described above in FIG. 1. Similarly, second semiconductor structure 204 can include a second device layer 222. In some embodiments, second semiconductor structure 204 is a memory array device chip or a peripheral device chip, and second device layer 222 includes a NAND memory string or a peripheral device, respectively, as described above in FIG. 1. Bonded structure 200 can further include a bonding interface 203 between first and second semiconductor structures 202 and 204. It is understood that bonded structure 200 can include any other suitable semiconductor devices, such as logic devices, volatile memory devices (e.g., dynamic random-access memory (DRAM) and static random-access memory (SRAM)), and non-volatile memory devices (e.g., Flash memory), in a 2D, 2.5D, or 3D architecture.

First semiconductor structure 202 can also include a first interconnect layer 210 above first device layer 208. First interconnect layer 210 includes interconnects 212 and 214 in one or more ILD layers, according to some embodiments. Two types of interconnects 212 and 214 can be formed in first interconnect layer 210 depending on their functionalities. In some embodiments, each interconnect 212 is a functional MEOL or BEOL interconnect (e.g., interconnect line or via contact) that is electrically connected to both first device layer 208 of first semiconductor structure 202 and second device layer 222 of second semiconductor structure 204 to transfer electrical signals across bonding interface 203 and between first and second semiconductor structure 202 and 204. Interconnect 214 can be a functional MEOL or BEOL interconnect (e.g., interconnect line or via contact) that is electrically connected to first device layer 208 of first semiconductor structure 202, but not second device layer 222 of second semiconductor structure 204, to transfer electrical signals within first semiconductor structure 202. In some embodiments, interconnect 214 is a dummy interconnect that is not electrically connected to first device layer 208 of first semiconductor structure 202. Interconnects 212 and 214 in first interconnect layer 210 can include conductive materials including, but not limited to, W, Co, Cu, Al, silicides, or any combination thereof. The ILD layers in first interconnect layer 210 can include dielectric materials including, but not limited to, silicon oxide, silicon nitride, silicon oxynitride, low-k dielectrics, or any combination thereof.

First semiconductor structure 202 can further include a first bonding layer 216 above first interconnect layer 210. First bonding layer 216 includes bonding contacts 218 and 220 in one ILD layer, according to some embodiments. To reduce the fabrication cost, first bonding layer 216 can be formed by a single patterning process (e.g., involving only one photolithography and development process) in a single ILD layer. As a result, in some embodiments, each bonding contact 218 or 220 has a nominally same critical dimension (e.g., the diameter of a via contact). In some embodiments, each bonding contact 218 or 220 is a single damascene contact, as opposed to a dual damascene contact. Two types of bonding contacts 218 and 220 can be formed in first bonding layer 216 depending on whether it is part of an electrical connection between first and second semiconductor structures 202 and 204. In some embodiments, each bonding contact 218 is a functional bonding contact that is part of an electrical connection across bonding interface 203 and between first and second semiconductor structures 202 and 204. In some embodiments, bonding contact 220 is a dummy bonding contact that is not part of an electrical connection across bonding interface 203 and between first and second semiconductor structures 202 and 204. Bonding contacts 218 and 220 in first bonding layer 216 can include conductive materials including, but not limited to, W, Co, Cu, Al, or any combination thereof. In some embodiments, bonding contacts 218 and 220 are made of Cu for hybrid bonding.

As described above, the density of bonding contacts can affect the hybrid bonding. In addition to functional bonding contacts 218 that are necessary for electrical interconnections, the density of bonding contacts can be increased to improve the hybrid bonding yield and strength by adding dummy bonding contacts 220 in first bonding layer 216. In some embodiments, to maximize the bonding contact density in first bonding layer 216, each of interconnects 212 and 214 is in contact with a respective one of bonding contacts 218 and 220. For example, interconnects 212 and 214 in first interconnect layer 210 and bonding contacts 218 and 220 in first bonding layer 216 have a one-to-one mapping relationship, and the number of bonding contacts 218 and 220 in first bonding layer 216 is the same as the number of interconnects 212 and 214 in first interconnect layer 210. Each interconnect 212 or 214 can act as an etch stop layer for forming corresponding bonding contact 218 or 220. In the areas without underneath interconnects 212 and 214, no bonding contact 218 or 220 is formed due to the lack of underneath etch stop layers (and all the bonding contacts 218 and 220 in first bonding layer 216 are formed by a single patterning process), according to some embodiments.

First bonding layer 216 can further include dielectrics 221 between and electrically isolating bonding contacts 218 and 220. Dielectrics 221 in first bonding layer 216 can include dielectric materials including, but not limited to, silicon oxide, silicon nitride, silicon oxynitride, low-k dielectrics, or any combination thereof. In some embodiments, dielectrics 221 are made of silicon oxide for hybrid bonding.

On the opposite side of bonding interface 203, second semiconductor structure 204 can also include a second interconnect layer 224 below second device layer 222. Second interconnect layer 224 includes interconnects 226 and 228 in one or more ILD layers, according to some embodiments. Two types of interconnects 226 and 228 can be formed in second interconnect layer 224 depending on their functionalities. In some embodiments, each interconnect 226 is a functional MEOL or BEOL interconnect (e.g., interconnect line or via contact) that is electrically connected to both first device layer 208 of first semiconductor structure 202 and second device layer 222 of second semiconductor structure 204 to transfer electrical signals across bonding interface 203 and between first and second semiconductor structure 202 and 204. Interconnect 228 can be a functional MEOL or BEOL interconnect (e.g., interconnect line or via contact) that is electrically connected to second device layer 222 of second semiconductor structure 204, but not first device layer 208 of first semiconductor structure 202, to transfer electrical signals within second semiconductor structure 204. In some embodiments, interconnect 228 is a dummy interconnect that is not electrically connected to second device layer 222 of second semiconductor structure 204. Interconnects 226 and 228 in second interconnect layer 224 can include conductive materials including, but not limited to, W, Co, Cu, Al, silicides, or any combination thereof. The ILD layers in second interconnect layer 224 can include dielectric materials including, but not limited to, silicon oxide, silicon nitride, silicon oxynitride, low-k dielectrics, or any combination thereof.

Second semiconductor structure 204 can further include a second bonding layer 230 below second interconnect layer 224. Second bonding layer 230 includes bonding contacts 232, 234, and 236 in two ILD layers, according to some embodiments. Different from first bonding layer 216, second bonding layer 230 can be formed by two patterning processes (e.g., two photolithography and development processes). As a result, bonding contacts 232, 234, and 236 in second bonding layer 230 can be formed in various designs. In some embodiments, bonding contacts 232 are dual damascene contacts, while bonding contacts 234 and 236 are single damascene contacts. For example, by two patterning processes, bonding contact 232 can include a first portion 232-1 having a first critical dimension in one ILD layer and a second portion 232-2 having a second critical dimension different from the first critical dimension in another ILD layer. As shown in FIG. 2A, first portion 232-1 of bonding contact 232 can be in contact with corresponding interconnect 226 in second interconnect layer 224, and second portion 232-2 of bonding contact 232 can be in contact with corresponding bonding contact 218 on the opposite side of bonding interface 203. Bonding contact 232 thus can be in contact with corresponding interconnect 226 in second interconnect layer 224. In contrast, bonding contacts 234 and 236 each does not include a first portion in contact with any interconnect in second interconnect layer 224, thereby being separated from interconnects 226 and 228 in second interconnect layer 224.

Two types of bonding contacts 232, 234, and 236 can be formed in second bonding layer 230 depending on whether it is part of an electrical connection between first and second semiconductor structures 202 and 204. In some embodiments, each bonding contact 232 is a functional bonding contact that is part of an electrical connection across bonding interface 203 and between first and second semiconductor structures 202 and 204. In some embodiments, bonding contact 234 or 236 is a dummy bonding contact that is not part of an electrical connection across bonding interface 203 and between first and second semiconductor structures 202 and 204. Bonding contacts 232, 234, and 236 in second bonding layer 230 can include conductive materials including, but not limited to, W, Co, Cu, Al, or any combination thereof. In some embodiments, bonding contacts 232, 234, and 236 are made of Cu for hybrid bonding.

As described above, the density of bonding contacts can affect the hybrid bonding. In addition to functional bonding contacts 232 that are necessary for electrical interconnections, the density of bonding contacts can be increased to improve the hybrid bonding yield and strength by adding dummy bonding contacts 234 in second bonding layer 230, which can form a high strength Cu—Cu fusion bonding with corresponding dummy bonding contacts 220 at bonding interface 203. In some cases, dummy bonding contact 236 in second bonding layer 230 may not have a corresponding dummy bonding contact in first bonding layer 216 on the opposite side of bonding interface 203 due to the lack of an underneath interconnect in first interconnect layer 210 to act as the etch stop layer. As a result, a Cu—SiO$_2$ bonding may be formed between dummy bonding contact 236 and dielectric 221 as well. That is, each bonding contact 218 or 220 in first bonding layer 216 is in contact with a respective bonding contact 232 or 234 in second bonding layer 230 across bonding interface 203, while one or more bonding contacts (e.g., dummy bonding contact 236) in second bonding layer 230 is not in contact with any bonding contact in first bonding layer 216, according to some embodiments. Thus, in some embodiments, the number of bonding contacts 232, 234, and 236 in second bonding layer 230 is greater than the number of bonding contacts 218 and 220 in first bonding layer 216.

Second bonding layer 230 can further include dielectrics 237 between and electrically isolating bonding contacts 232, 234, and 236. Dielectrics 237 in second bonding layer 230 can include dielectric materials including, but not limited to, silicon oxide, silicon nitride, silicon oxynitride, low-k dielectrics, or any combination thereof. In some embodiments, dielectrics 237 are made of silicon oxide for hybrid bonding.

As shown in FIG. 2A, in bonded structure 200, a pair of functional bonding contacts 218 and 232 can be in contact with one another at bonding interface 203 and also in contact with a pair of interconnects 212 and 226 on opposite sides of bonding interface 203, respectively, to electrically connect the pair of interconnects 212 and 226. An electrical connection can thus be formed between the pair of interconnects 212 and 226 by the pair of functional bonding contacts 218 and 232. The pair of functional bonding contacts 218 and 232 also form a high strength Cu—Cu fusion bonding at bonding interface 203, according to some embodiments. On the other hand, in some embodiments. a pair of dummy bonding contacts 220 and 234 are in contact with one another at bonding interface 203 to form a high strength Cu—Cu fusion bonding at bonding interface 203 as well. The pair of dummy bonding contacts 220 and 234 are in contact with interconnect 214 (by dummy bonding contact 220) on one side of bonding interface 203 but separated from any interconnect 226 or 228 on the opposite side of bonding interface 203, according to some embodiments, thereby avoiding forming an electrical connection between interconnects across bonding interface 203. In some embodiments, at least one dummy bonding contact 236 is separated from any bonding contact 218 or 220 at bonding interface 203, and a pair of dummy bonding contact 236 and dielectric 221 thus form a Cu—SiO$_2$ bonding at bonding interface 203. In some embodiments, the remaining areas of first and second bonding layers 216 and 230, e.g., dielectrics 221 and 237, form SiO$_2$—SiO$_2$ covalent bonding at bonding interface 203.

FIG. 2B illustrates a bonded structure 201 that is similar to bonded structure 200 illustrated in FIG. 2A except that the relative vertical positions of the components in first and second semiconductor structures 202 and 204 are switched. In other words, bonded structure 200 (except substrate 206) can be flipped vertically along bonding interface 203 to become bonded structure 201. Nevertheless, dummy bonding contacts can be added to bonded structures 200 and 201 to increase bonding contacts density (and Cu—Cu fusion bonding in some embodiments) at bonding interface 203 to achieve better bonding performance. The design and arrangement of dummy bonding contacts can accommodate the reduction of total patterning processes in forming the dummy bonding contacts, thereby reducing the fabrication cost. For example, on one side of bonding interface 203, the bonding contacts can be all single damascene contacts formed by a single patterning process.

Figure 3:
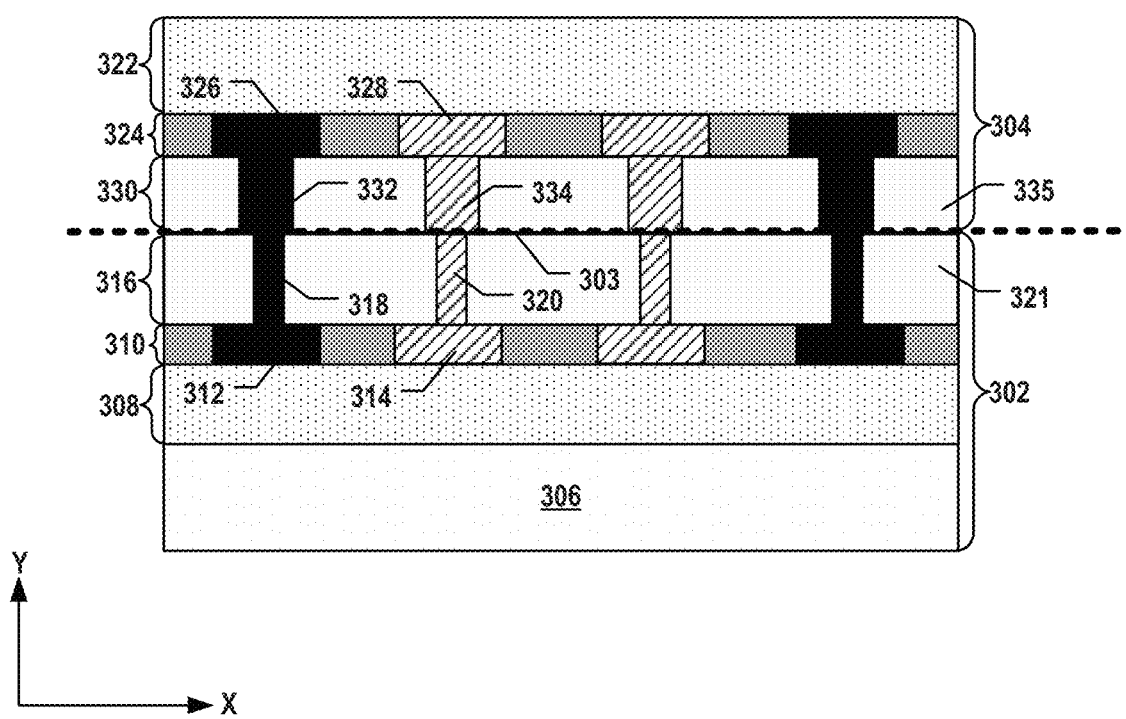
FIG. 3 illustrates a cross-section of an exemplary bonded semiconductor device including dummy bonding contacts and dummy interconnects, according to some embodiments of the present disclosure.

FIG. 3 illustrates a cross-section of an exemplary bonded structure 300 including dummy bonding contacts and dummy interconnects, according to some embodiments of the present disclosure. Different from bonded structures 200 and 201 in which bonding contacts on only one side of the bonding interface are single damascene contacts formed by a single patterning process, in bonded structure 300 in FIG. 3, bonding contacts on both sides of a bonding interface 303 between a first semiconductor structure 302 and a second semiconductor structure 304 can be single damascene contacts formed by a single patterning process. By further reducing the number of patterning processes for forming the bonding contacts, the fabrication cost can be further decreased.

As shown in FIG. 3, first semiconductor structure 302 is disposed below second semiconductor structure 304 in bonded structure 300 and includes a substrate 306, according to some embodiments. First semiconductor structure 302 can also include a first device layer 308 above substrate 306. In some embodiments, first semiconductor structure 302 is a peripheral device chip or a memory array device chip, and first device layer 308 includes a peripheral device or a NAND memory string, respectively, as described above in FIG. 1. Similarly, second semiconductor structure 304 can include a second device layer 322. In some embodiments, second semiconductor structure 304 is a memory array device chip or a peripheral device chip, and second device layer 322 includes a NAND memory string or a peripheral device, respectively, as described above in FIG. 1.

First semiconductor structure 302 can also include a first interconnect layer 310 above first device layer 308. First interconnect layer 310 includes interconnects 312 and 314 in one or more ILD layers, according to some embodiments. Two types of interconnects 312 and 314 can be formed in first interconnect layer 310 depending on their functionalities. In some embodiments, each interconnect 312 is a functional MEOL or BEOL interconnect (e.g., interconnect line or via contact) that is electrically connected to both first device layer 308 of first semiconductor structure 302 and second device layer 322 of second semiconductor structure 304 to transfer electrical signals across bonding interface 303 and between first and second semiconductor structure 302 and 304. In some embodiments, each interconnect 314 is a dummy interconnect that is not electrically connected to first device layer 308 (and the peripheral device or NAND memory string therein for example) of first semiconductor structure 302. As described below in detail, dummy interconnects 314 can be added into first interconnect layer 310 in order to allow more dummy bonding contacts to be formed thereabove, thereby further increasing the bonding contact density at bonding interface 303. Interconnects 312 and 314 in first interconnect layer 310 can include conductive materials including, but not limited to, W, Co, Cu, Al, silicides, or any combination thereof. The ILD layers in first interconnect layer 310 can include dielectric materials including, but not limited to, silicon oxide, silicon nitride, silicon oxynitride, low-k dielectrics, or any combination thereof.

First semiconductor structure 302 can further include a first bonding layer 316 above first interconnect layer 310. First bonding layer 316 includes bonding contacts 318 and 320 in one ILD layer, according to some embodiments. To reduce the fabrication cost, first bonding layer 316 can be formed by a single patterning process (e.g., involving only one photolithography and development process) in a single ILD layer. As a result, in some embodiments, each bonding contact 318 or 320 has a nominally same critical dimension (e.g., the diameter of a via contact). In some embodiments, each bonding contact 318 or 320 is a single damascene contact, as opposed to a dual damascene contact. Two types of bonding contacts 318 and 320 can be formed in first bonding layer 316 depending on whether it is part of an electrical connection between first and second semiconductor structures 302 and 304. In some embodiments, each bonding contact 318 is a functional bonding contact that is in contact with corresponding functional interconnect 312 and that is part of an electrical connection across bonding interface 303 and between first and second semiconductor structures 302 and 304. In some embodiments, bonding contact 320 is a dummy bonding contact that is in contact with corresponding dummy interconnect 314 and that is not part of an electrical connection across bonding interface 303 and between first and second semiconductor structures 302 and 304. Bonding contacts 318 and 320 in first bonding layer 316 can include conductive materials including, but not limited to, W, Co, Cu, Al, or any combination thereof. In some embodiments, bonding contacts 318 and 320 are made of Cu for hybrid bonding.

As described above, the density of bonding contacts can affect the hybrid bonding. In addition to functional bonding contacts 318 that are necessary for electrical interconnections, the density of bonding contacts can be increased to improve the hybrid bonding yield and strength by adding dummy interconnects 314 in first interconnect layer 310 and corresponding dummy bonding contacts 320 in first bonding layer 316. In some embodiments, to maximize the bonding contact density in first bonding layer 316, each of interconnects 312 and 314 is in contact with a respective one of bonding contacts 318 and 320. For example, interconnects 312 and 314 in first interconnect layer 310 and bonding contacts 318 and 320 in first bonding layer 316 have a one-to-one mapping relationship, and the number of bonding contacts 318 and 320 in first bonding layer 316 is the same as the number of interconnects 312 and 314 in first interconnect layer 310. Each interconnect 312 or 314 can act as an etch stop layer for forming corresponding bonding contact 318 or 320. In the areas without underneath interconnects 312 and 314, no bonding contact 318 or 320 is formed due to the lack of underneath etch stop layers (and all the bonding contacts 318 and 320 in first bonding layer 316 are formed by a single patterning process), according to some embodiments.

First bonding layer 316 can further include dielectrics 321 between and electrically isolating bonding contacts 318 and 320. Dielectrics 321 in first bonding layer 316 can include dielectric materials including, but not limited to, silicon oxide, silicon nitride, silicon oxynitride, low-k dielectrics, or any combination thereof. In some embodiments, dielectrics 321 are made of silicon oxide for hybrid bonding.

On the opposite side of bonding interface 303, second semiconductor structure 304 can also include a second interconnect layer 324 below second device layer 322. Second interconnect layer 324 includes interconnects 326 and 328 in one or more ILD layers, according to some embodiments Two types of interconnects 326 and 328 can be formed in second interconnect layer 324 depending on their functionalities. In some embodiments, each interconnect 326 is a functional MEOL or BEOL interconnect (e.g., interconnect line or via contact) that is electrically connected to both first device layer 308 of first semiconductor structure 302 and second device layer 322 of second semiconductor structure 304 to transfer electrical signals across bonding interface 303 and between first and second semiconductor structure 302 and 304. In some embodiments, each interconnect 328 is a dummy interconnect that is not electrically connected to second device layer 322 (and the peripheral device or NAND memory string therein for example) of second semiconductor structure 304. As described below in detail, dummy interconnects 328 can be added into second interconnect layer 324 in order to allow more dummy bonding contacts to be formed therebelow, thereby further increasing the bonding contact density at bonding interface 303. Interconnects 326 and 328 in second interconnect layer 324 can include conductive materials including, but not limited to, W, Co, Cu, Al, silicides, or any combination thereof. The ILD layers in second interconnect layer 324 can include dielectric materials including, but not limited to, silicon oxide, silicon nitride, silicon oxynitride, low-k dielectrics, or any combination thereof.

Second semiconductor structure 304 can further include a second bonding layer 330 below second interconnect layer 324. Different from second bonding layer 230 in FIGS. 2A and 2B having two ILD layers, second bonding layer 330 includes bonding contacts 332 and 334 in one ILD layer, according to some embodiments. To reduce the fabrication cost, second bonding layer 330 can be formed by a single patterning process (e.g., involving only one photolithography and development process) in a single ILD layer as well, just like first bonding layer 316 on the opposite side of bonding interface 303. As a result, in some embodiments, each bonding contact 332 or 334 has a nominally same critical dimension (e.g., the diameter of a via contact). In some embodiments, each bonding contact 332 or 334 is a single damascene contact, as opposed to a dual damascene contact. Two types of bonding contacts 332 and 334 can be formed in second bonding layer 330 depending on whether it is part of an electrical connection between first and second semiconductor structures 302 and 304. In some embodiments, each bonding contact 332 is a functional bonding contact that is in contact with corresponding functional interconnect 326 and that is part of an electrical connection across bonding interface 303 and between first and second semiconductor structures 302 and 304. In some embodiments, bonding contact 334 is a dummy bonding contact that is in contact with corresponding dummy interconnect 328 and that is not part of an electrical connection across bonding interface 303 and between first and second semiconductor structures 302 and 304. Bonding contacts 332 and 334 in second bonding layer 330 can include conductive materials including, but not limited to, W, Co, Cu, Al, or any combination thereof. In some embodiments, bonding contacts 332 and 334 are made of Cu for hybrid bonding.

As described above, the density of bonding contacts can affect the hybrid bonding. In addition to functional bonding contacts 332 that are necessary for electrical interconnections, the density of bonding contacts can be increased to improve the hybrid bonding yield and strength by adding dummy interconnects 328 in second interconnect layer 324 and corresponding dummy bonding contacts 334 in second bonding layer 330. In some embodiments, to maximize the bonding contact density in second bonding layer 330, each of interconnects 326 and 328 is in contact with a respective one of bonding contacts 332 and 334. For example, interconnects 326 and 328 in second interconnect layer 324 and bonding contacts 332 and 334 in second bonding layer 330 have a one-to-one mapping relationship, and the number of bonding contacts 332 and 334 in second bonding layer 330 is the same as the number of interconnects 326 and 328 in second interconnect layer 324. Each interconnect 326 or 328 can act as an etch stop layer for forming corresponding bonding contact 332 or 334. In the areas without underneath interconnects 326 and 328, no bonding contact 332 or 334 is formed due to the lack of underneath etch stop layers (and all the bonding contacts 332 and 334 in second bonding layer 330 are formed by a single patterning process), according to some embodiments.

Second bonding layer 330 can further include dielectrics 335 between and electrically isolating bonding contacts 332 and 334. Dielectrics 335 in second bonding layer 330 can include dielectric materials including, but not limited to, silicon oxide, silicon nitride, silicon oxynitride, low-k dielectrics, or any combination thereof. In some embodiments, dielectrics 335 are made of silicon oxide for hybrid bonding.

Different from FIGS. 2A and 2B in which the number of bonding contacts in second bonding layer 230 (formed by two patterning processes) may be greater than the number of bonding contacts in first bonding layer 216 (formed by a single patterning process), in FIG. 3, the number of bonding contacts 332 and 334 in second bonding layer 330 (formed by a single patterning process) is the same as the number of bonding contacts in first bonding layer 316 (formed by a single patterning process). Each bonding contact 318 or 320 in first bonding layer 316 can be in contact with a respective bonding contact 332 or 334 in second bonding layer 330 at bonding interface 303. In other words, the bonding contacts on the opposite sides of bonding interface 303 have a one-to-one mapping relationship, according to some embodiments. Because functional bonding contacts 318 and 332 are paired and dummy bonding contacts 320 and 334 are paired as well, no bonding contact can be paired with dielectrics 321 or 335 to form, for example, a Cu—SiO$_2$ bonding. Consequently, the number of high strength Cu—Cu bondings can be further increased at bonding interface 303 to improve the bonding performance.

As shown in FIG. 3, in bonded structure 300, a pair of functional bonding contacts 318 and 332 can be in contact with one another at bonding interface 303 and also in contact with a pair of functional interconnects 312 and 326 on opposite sides of bonding interface 303, respectively, to electrically connect the pair of functional interconnects 312 and 326. An electrical connection can thus be formed between the pair of functional interconnects 312 and 326 by the pair of functional bonding contacts 318 and 332. The pair of functional bonding contacts 318 and 332 also form a high strength Cu—Cu fusion bonding at bonding interface 303, according to some embodiments. On the other hand, in some embodiments, a pair of dummy bonding contacts 320 and 334 are in contact with one another at bonding interface 303 to form a high strength Cu—Cu fusion bonding at bonding interface 303 as well. The pair of dummy bonding contacts 320 and 334 are in contact with a pair of dummy interconnects 314 and 328 on opposite sides of bonding interface 303, according to some embodiments. In some embodiments, the remaining areas of first and second bonding layers 316 and 330, e.g., dielectrics 321 and 335, form a SiO$_2$—SiO$_2$ covalent bonding at bonding interface 303.

By introducing dummy interconnects 314 and 328 on both sides of bonding interface 303, the flexibility of arranging dummy bonding contacts 320 and 332 can be increased. In some embodiments, to further increase the hybrid bonding yield and strength, bonding contacts on each side of bonding interface 303 are nominally evenly disposed at bonding interface 303 in a plan view (not shown). In some embodiments, the local density and/or global density of bonding contacts can be adjusted to accommodate various designs of bonded structure 300 by adding paired dummy interconnects and dummy contacts accordingly.

It is understood that bonded structure 200, 201, or 300 can include or be combined with other structures, such as device layer(s), interconnect layer(s), and substrate(s), to form any suitable semiconductor devices, for example, logic devices, volatile memory devices (e.g., dynamic random-access memory (DRAM) and static random-access memory (SRAM)), and non-volatile memory devices (e.g., Flash memory), in a 2D, 2.5D, or 3D architecture.

Figure 4A:
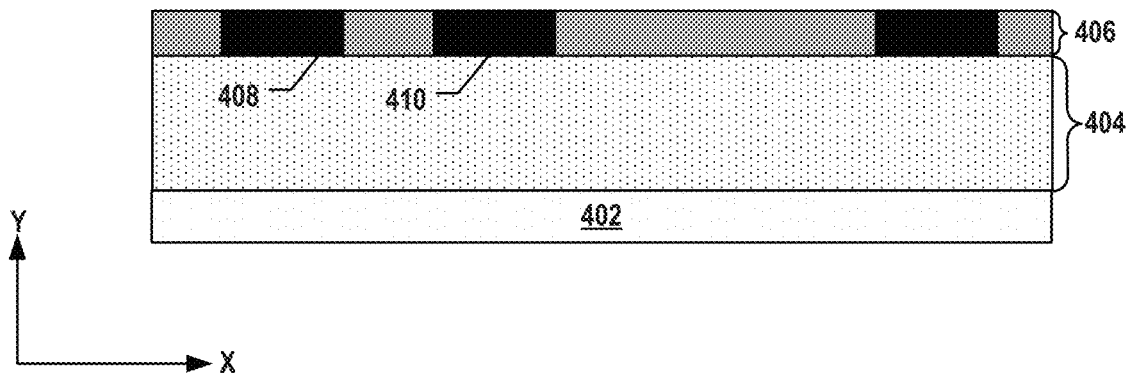
FIGS. 4A and 4B illustrate an exemplary fabrication process for forming a first semiconductor structure including dummy bonding contacts, according to some embodiments of the present disclosure.
Figure 4B:
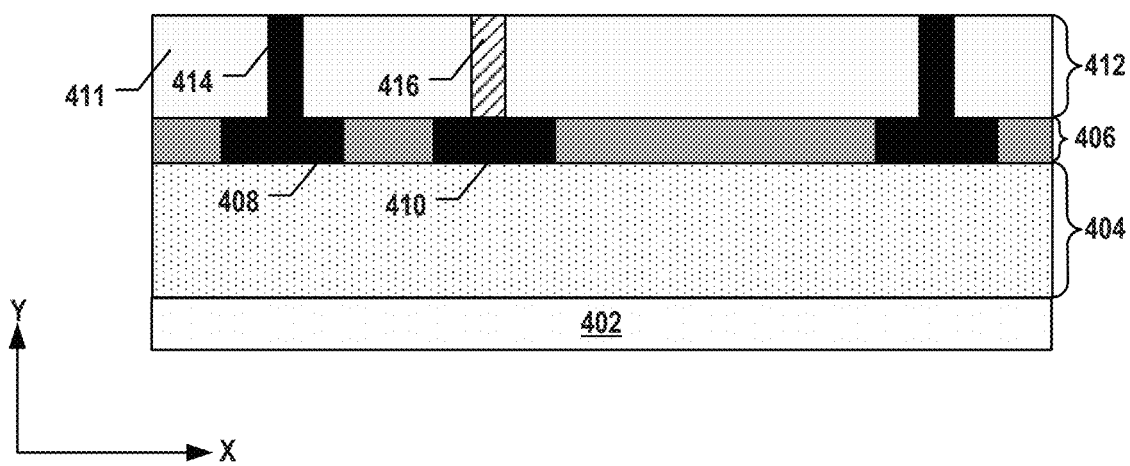
Figure 5A:
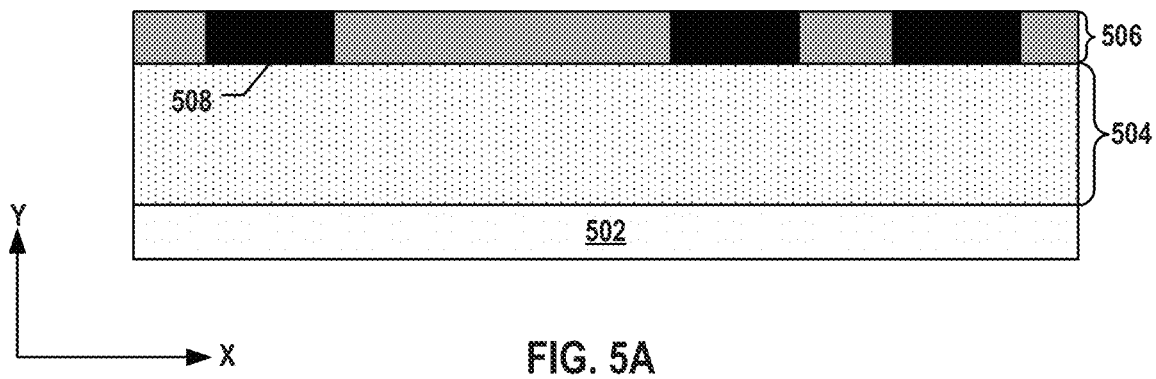
FIGS. 5A-5C illustrate an exemplary fabrication process for forming a second semiconductor structure including dummy bonding contacts, according to some embodiments of the present disclosure.
Figure 5B:
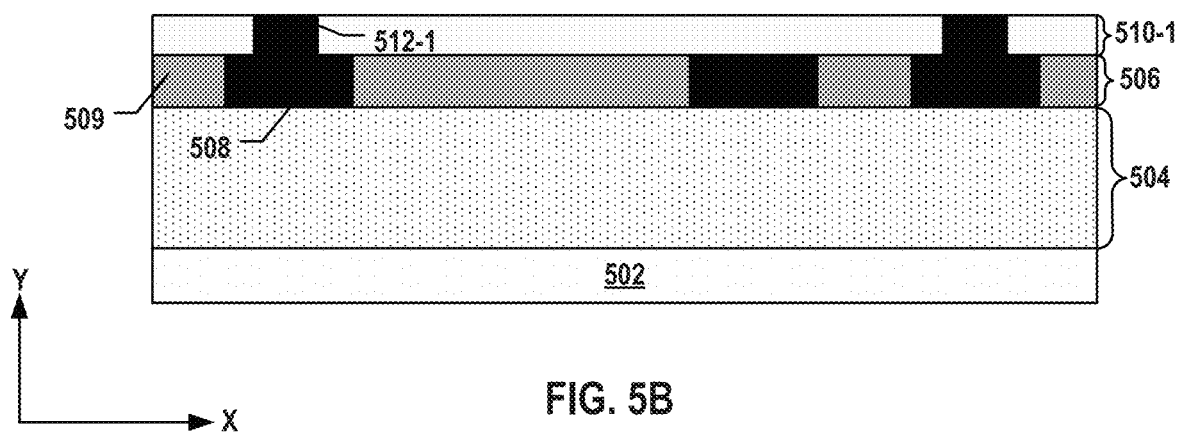
Figure 5C:
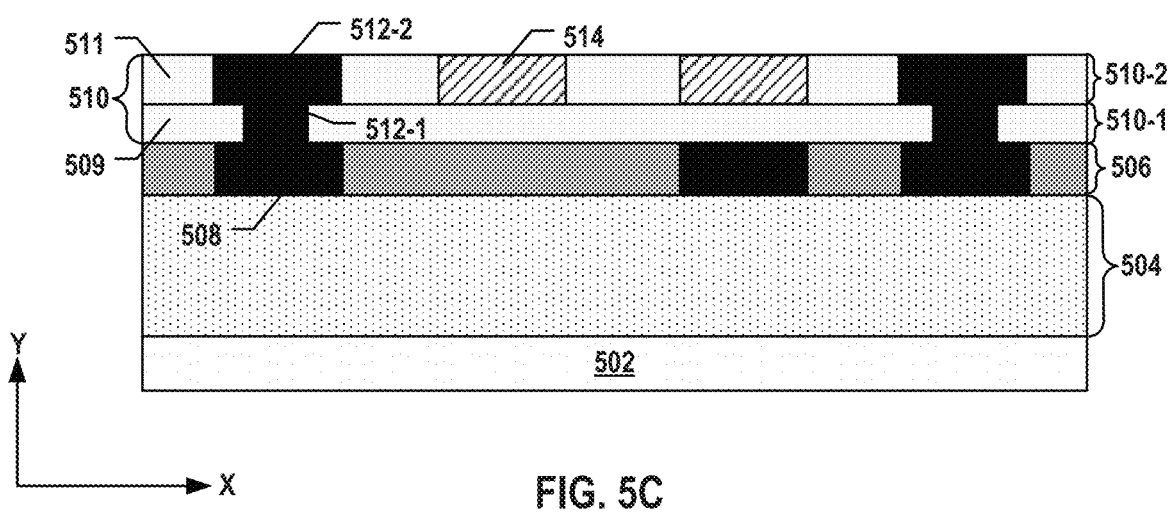
Figure 6:
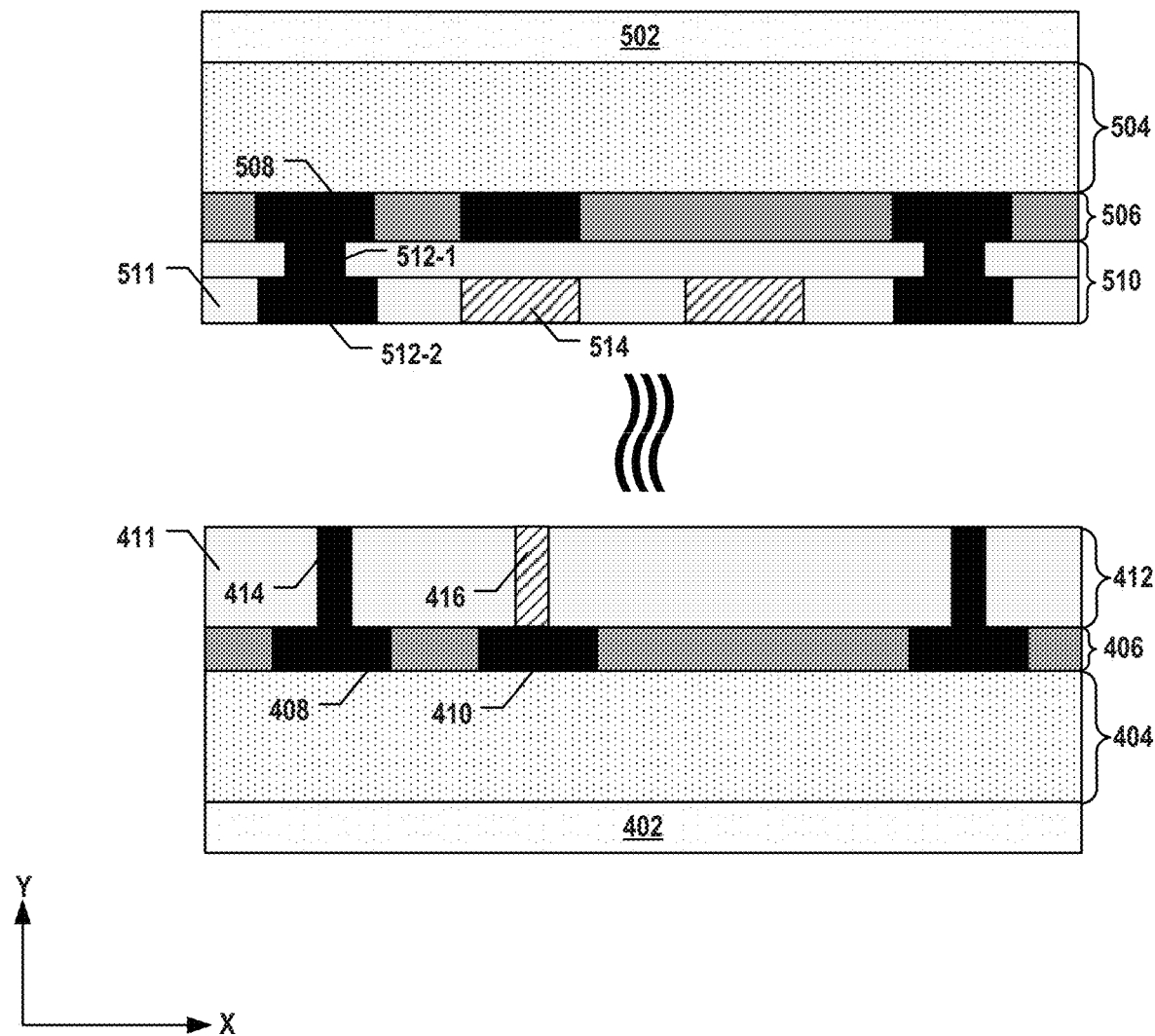
FIG. 6 illustrates an exemplary fabrication process for bonding a first semiconductor structure and a second semiconductor structure, according to some embodiments of the present disclosure.
Figure 10:
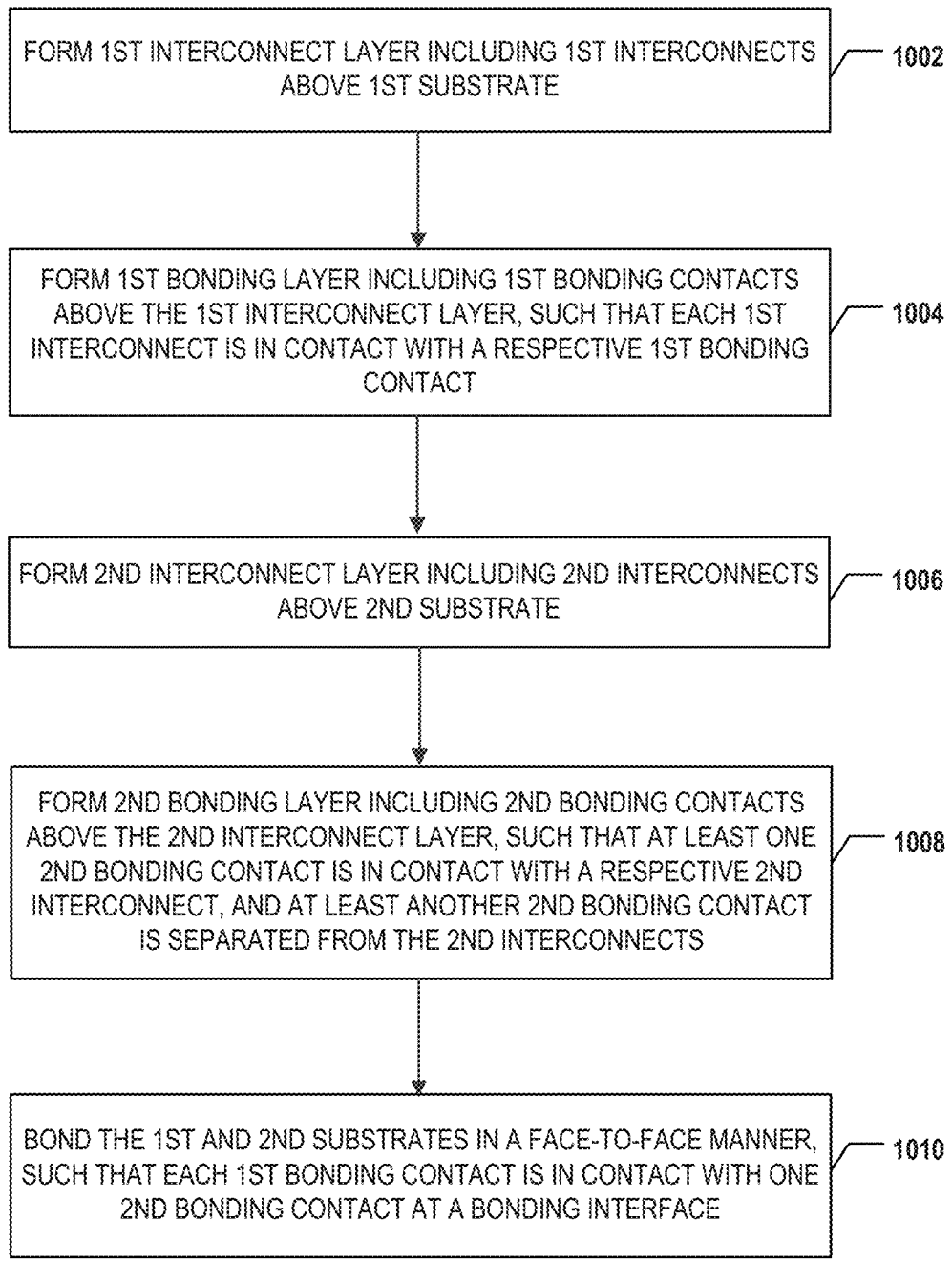
FIG. 10 is a flowchart of a method for forming an exemplary bonded semiconductor device including dummy bonding contacts, according to some embodiments of the present disclosure.

FIGS. 4A and 4B illustrate an exemplary fabrication process for forming a first semiconductor structure including dummy bonding contacts, according to some embodiments of the present disclosure. FIGS. 5A-5C illustrate an exemplary fabrication process for forming a second semiconductor structure including dummy bonding contacts, according to some embodiments of the present disclosure. FIG. 6 illustrates an exemplary fabrication process for bonding the first semiconductor structure and the second semiconductor structure, according to some embodiments of the present disclosure. FIG. 10 is a flowchart of a method for forming an exemplary bonded semiconductor device including dummy bonding contacts, according to some embodiments of the present disclosure. Examples of the bonded semiconductor device depicted in FIGS. 4-6 and 10 include bonded structures 200 and 201 depicted in FIGS. 2A and 2B. FIGS. 4-6 and 10 will be described together. It is understood that the operations shown in method 1000 are not exhaustive and that other operations can be performed as well before, after, or between any of the illustrated operations. Further, some of the operations may be performed simultaneously, or in a different order than shown in FIGS. 4-6 and 10.

Referring to FIG. 10, method 1000 starts at operation 1002, in which a first interconnect layer including a plurality of first interconnects is formed above a first substrate. The first substrate can be a silicon substrate. In some embodiments, a first device layer is formed between the first substrate and the first interconnect layer prior to forming the first interconnect layer. The first device layer can include a NAND memory string or a peripheral device.

As illustrated in FIG. 4A, a first device layer 404 is formed above a silicon substrate 402. In some embodiments, first device layer 404 is a peripheral device layer including a plurality of transistors (not shown) formed on silicon substrate 402 by a plurality of processes including, but not limited to, photolithography, dry/wet etch, thin film deposition, thermal growth, implantation, CMP, and any other suitable processes.

In some embodiments, first device layer 404 is a memory array device layer including a plurality of NAND memory strings (not shown) each extending vertically through a memory stack (not shown) formed on silicon substrate 402. To form the memory stack, a dielectric stack including an alternating stack of sacrificial layers (e.g., silicon nitride) and dielectric layers (e.g., silicon oxide) can be formed on silicon substrate 402 by one or more thin film deposition processes including, but not limited to, CVD, physical vapor deposition (PVD), atomic layer deposition (ALD), or any combination thereof. The memory stack then can be formed on silicon substrate 402 by gate replacement processes, i.e., replacing the sacrificial layers in the dielectric stack with conductor layers. In some embodiments, fabrication processes to form the NAND memory strings include forming a semiconductor channel that extends vertically through the dielectric stack, forming a composite dielectric layer (memory film) between the semiconductor channel and the dielectric stack, including, but not limited to, a tunneling layer, a storage layer, and a blocking layer. The semiconductor channel and the memory film can be formed by one or more thin film deposition processes such as ALD, CVD, PVD, any other suitable processes, or any combination thereof.

As illustrated in FIG. 4A, a first interconnect layer 406 is formed above first device layer 404. First interconnect layer 406 can include interconnects 408 and 410, including interconnect lines and via contacts in one or more ILD layers, to make electrical connections with first device layer 404. In some embodiments, first interconnect layer 406 includes multiple ILD layers and interconnects therein formed by multiple processes. For example, interconnects 408 and 410 can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 1000 proceeds to operation 1004, as illustrated in FIG. 6, in which a first bonding layer including a plurality of first bonding contacts is formed above the first interconnect layer, such that each of the first interconnects is in contact with a respective one of the first bonding contacts. A first dielectric can be formed in the first bonding layer as well. In some embodiments, the first bonding contacts in the first bonding layers are formed by a single patterning process. In some embodiments, the number of the first bonding contacts is the same as the number of first interconnects. Each of the first bonding contacts has a nominally same critical dimension, according to some embodiments.

As illustrated in FIG. 4B, a layer of dielectric 411 is deposited on the top surface of first interconnect layer 406 by a thin film deposition process including, but not limited to, CVD, PVD, ALD, or any combination thereof. Bonding contacts 414 and 416 are formed in dielectric 411 to form a first bonding layer 412 above first interconnect layer 406 and first device layer 404, according to some embodiments. Bonding contact 414 and 416 can be patterned by a single patterning process involving only one photolithography process. In some embodiments, etch masks (photoresist and/or hard masks) are patterned by a single patterning process to expose dielectric 411 only at the areas where interconnects 408 and 410 are formed underneath. Opening (e.g., a via hole and/or a trench) then can be etched through first bonding layer 412 until being stopped by underneath interconnects 408 and 410 as etch stop layers using dry etch and/or wet etch. Bonding contacts 414 and 416 can include a barrier/adhesion layer and a conductor (e.g., a metal) deposited subsequently in this order by one or more thin film deposition processes including, but not limited to, CVD, PVD, ALD, electrochemical depositions, or any combination thereof, to fill the openings. The excess conductor can be removed by CMP, and the top surface of first bonding layer 412 can be planarized for bonding.

Method 1000 proceeds to operation 1006, as illustrated in FIG. 10, in which a second interconnect layer including a plurality of second interconnects is formed above a second substrate. The second substrate can be a silicon substrate. In some embodiments, a second device layer is formed between the second substrate and the second interconnect layer prior to forming the second interconnect layer. The second device layer can include a peripheral device or a NAND memory string.

As illustrated in FIG. 5A, a second device layer 504 is formed above a silicon substrate 502. In some embodiments, second device layer 504 is a memory array device layer including a plurality of NAND memory strings (not shown) each extending vertically through a memory stack (not shown) formed on silicon substrate 502. The details of forming the memory array device layer are described above and will not be repeated. In some embodiments, second device layer 504 is a peripheral device layer including a plurality of transistors (not shown) formed on silicon substrate 502 by a plurality of processes including, but not limited to, photolithography, dry/wet etch, thin film deposition, thermal growth, implantation, CMP, and any other suitable processes.

As illustrated in FIG. 5A, a second interconnect layer 506 is formed above second device layer 504. Second interconnect layer 506 can include interconnects 508, including interconnect lines and via contacts in one or more ILD layers, to make electrical connections with second device layer 504. In some embodiments, second interconnect layer 506 includes multiple ILD layers and interconnects therein formed by multiple processes. For example, interconnects 508 can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 1000 proceeds to operation 1008, as illustrated in FIG. 10, in which a second bonding layer including a plurality of second bonding contacts is formed above the second interconnect layer, such that at least one of the second bonding contacts is in contact with a respective one of the second interconnects, and at least another one of the second bonding contacts is separated from the second interconnects. A second dielectric can be formed in the second bonding layer as well. In some embodiments, the second bonding contacts in the second bonding layers are formed by two patterning processes. In some embodiments, to form the second bonding layer, first portions of second bonding contacts are formed above the second interconnects by one of the two patterning processes, and second portions of second bonding contacts are formed above the first portions of second bonding contacts by another one of the two patterning processes. The number of the second portions of second bonding contacts is greater than the number of the first portions of second bonding contacts, according to some embodiments.

As illustrated in FIG. 5B, a first layer of dielectric 509 is deposited on the top surface of second interconnect layer 506 by a thin film deposition process including, but not limited to, CVD, PVD, ALD, or any combination thereof. First portions of bonding contact 512-1 are formed in dielectric 509 to form a first bonding sub-layer 510-1 above second interconnect layer 506 and second device layer 504, according to some embodiments. First portions of bonding contact 512-1 can be patterned by a first patterning process involving one photolithography process. In some embodiments, etch masks (photoresist and/or hard masks) are patterned by the first patterning process to expose dielectric 509 only at the areas where cross-chip electrical connections are to be formed. Opening (e.g., a via hole and/or a trench) then can be etched through first bonding sub-layer 510-1 until being stopped by underneath interconnects 508 as etch stop layers using dry etch and/or wet etch. First portions of bonding contact 512-1 can include a barrier/adhesion layer and a conductor (e.g., a metal) deposited subsequently in this order by one or more thin film deposition processes including, but not limited to, CVD, PVD, ALD, electrochemical depositions, or any combination thereof, to fill the openings. The excess conductor can be removed by CMP, and the top surface of first bonding sub-layer 510-1 can be planarized.

As illustrated in FIG. 5C, a second layer of dielectric 511 is deposited on the top surface of first bonding sub-layer 510-1 by a thin film deposition process including, but not limited to, CVD, PVD, ALD, or any combination thereof. Second portions of bonding contact 512-2 and 514 are formed in dielectric 511 to form a second bonding sub-layer 510-2 above first bonding sub-layer 510-1, according to some embodiments. First and second bonding sub-layers 510-1 and 510-2 can together be referred to here as a second bonding layer 510. Second portions of bonding contact 512-2 and 514 can be patterned by a second patterning process involving one photolithography process. In some embodiments, etch masks (photoresist and/or hard masks) are patterned by the second patterning process to expose dielectric 511 at the areas where first portions of bonding contacts 512-1 are formed underneath, such that first and second portions of bonding contacts 512-1 and 512-2 can together form a functional bonding contact electrically connected to underneath interconnects 508. Additionally, etch masks (photoresist and/or hard masks) can be patterned by the second patterning process to expose dielectric 511 at the areas where dummy bonding contacts 514 can be formed to increase the bonding performance. Opening (e.g., a via hole and/or a trench) then can be etched through second bonding sub-layer 510-2 using dry etch and/or wet etch. Second portions of bonding contacts 512-2 and 514 can include a barrier/adhesion layer and a conductor (e.g., a metal) deposited subsequently in this order by one or more thin film deposition processes including, but not limited to, CVD, PVD, ALD, electrochemical depositions, or any combination thereof, to fill the openings. The excess conductor can be removed by CMP, and the top surface of second bonding layer 510 can be planarized for bonding.

Method 1000 proceeds to operation 1010, as illustrated in FIG. 10, in which the first substrate and the second substrate are bonded in a face-to-face manner, such that each of the first bonding contacts is in contact with one of the second bonding contacts at a bonding interface. The first dielectric can be in contact with the second dielectric as well after the bonding. The bonding can be hybrid bonding.

As illustrated in FIG. 6, silicon substrate 502 and second device layer 504 formed thereon are flipped upside down. Second bonding layer 510 facing down is to be bonded with first bonding layer 412 facing up, i.e., in a face-to-face manner. In some embodiments, bonding contacts 414 and 416 are aligned with bonding contacts 512 and 514 prior to hybrid bonding, such that each bonding contact 414 or 416 is in contact with one of bonding contacts 512 and 514 at a bonding interface after the hybrid bonding, according to some embodiments. In some embodiments, a treatment process, e.g., a plasma treatment, a wet treatment, and/or a thermal treatment, is applied to the bonding surfaces prior to the hybrid bonding. As a result of the hybrid bonding, bonding contacts 414 and 416 can be inter-mixed with bonding contacts 512 and 514, and dielectric 411 can be covalent-bonded with dielectric 511, thereby forming a bonding interface between first bonding layer 412 and second bonding layer 510.

It is understood that although second bonding layer 510 is flipped upside down and is above first bonding layer 412 in the resulting bonded structure as shown in FIG. 6, in some embodiments, first bonding layer 412 is flipped upside down and is above second bonding layer 510 in the resulting bonded structure. In one example, first device layer 404 can be a peripheral device layer, and second device layer 504 can be a memory array device layer. In another example, first device layer 404 can be a memory array device layer, and second device layer 504 can be a peripheral device layer. In still another example, first and second device layers 404 and 504 can be both peripheral device layers. In yet another example, first and second device layers 404 and 504 can be both memory array device layers.

Figure 7A:
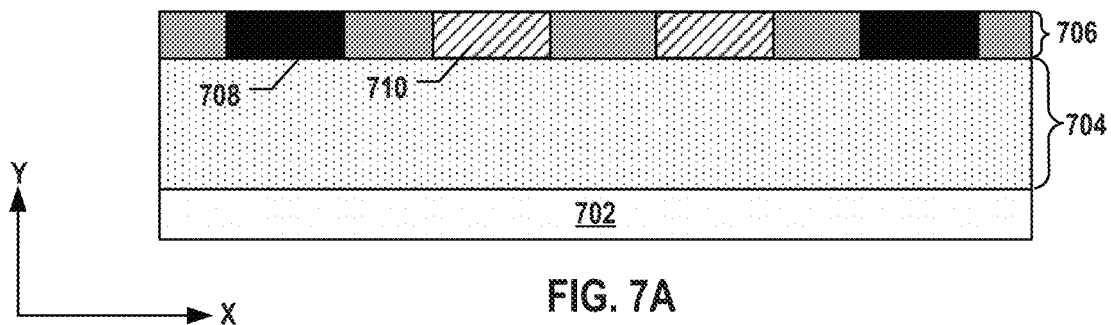
FIGS. 7A and 7B illustrate an exemplary fabrication process for forming a first semiconductor structure including dummy bonding contacts and dummy interconnects, according to some embodiments of the present disclosure.
Figure 7B:
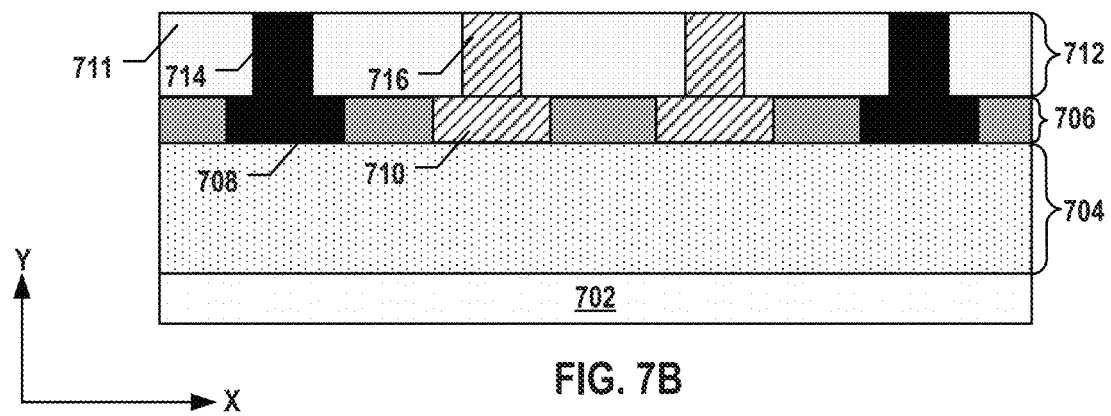
Figure 8A:
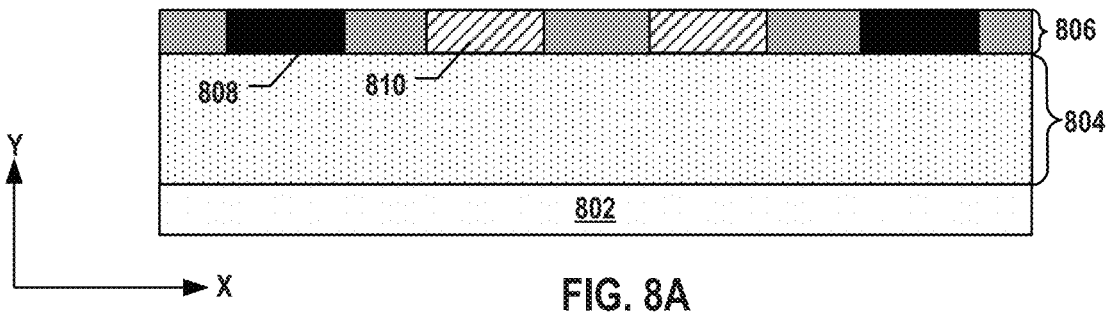
FIGS. 8A and 8B illustrate an exemplary fabrication process for forming a second semiconductor structure including dummy bonding contacts and dummy interconnects, according to some embodiments of the present disclosure.
Figure 8B:
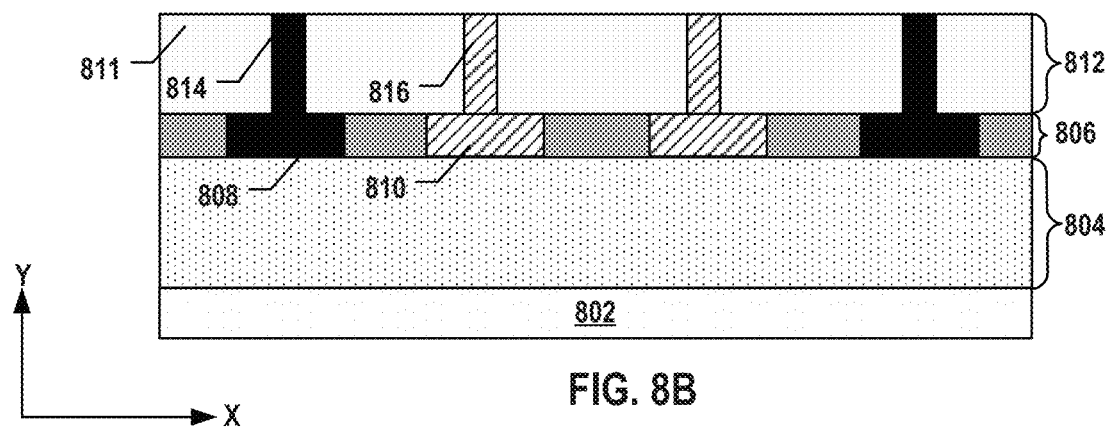
Figure 9:
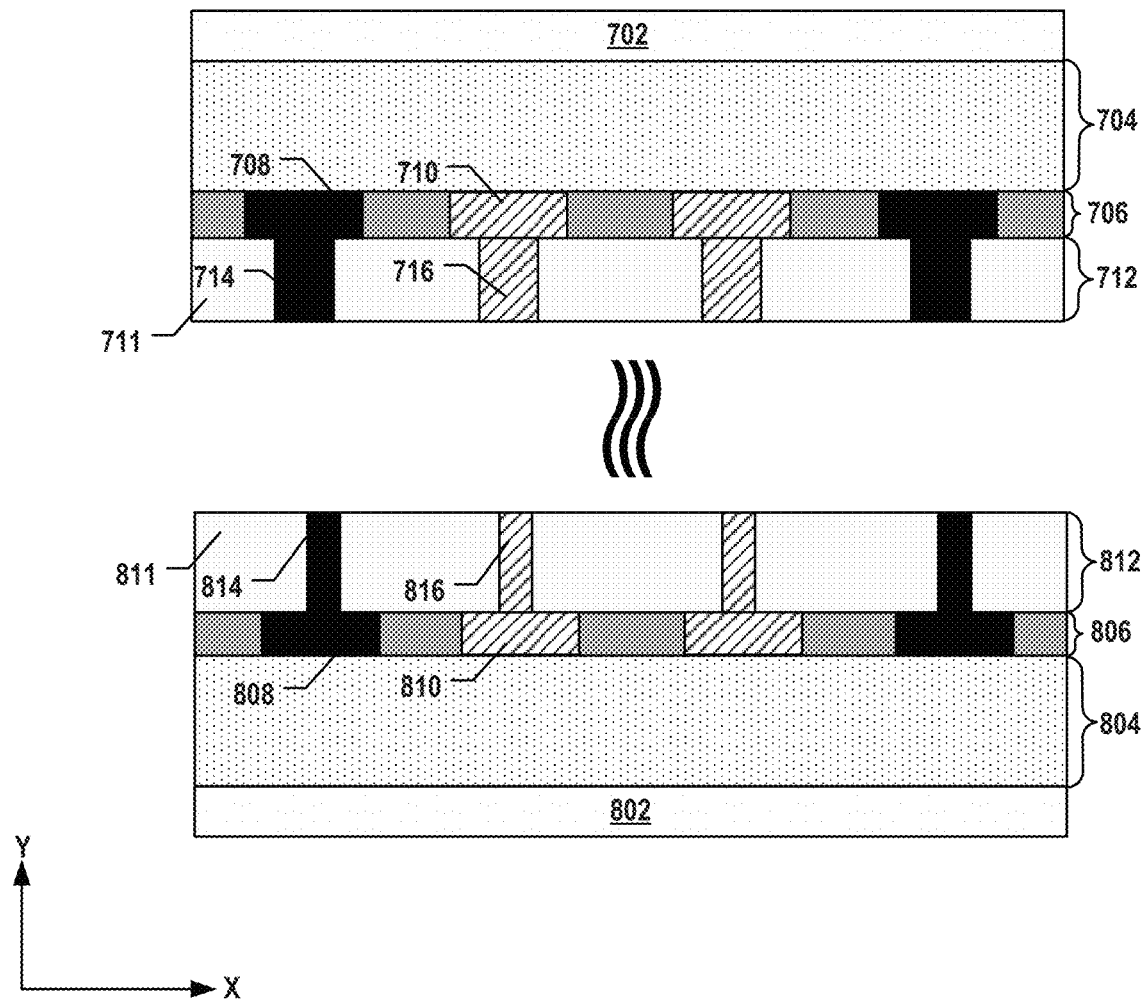
FIG. 9 illustrates another exemplary fabrication process for bonding a first semiconductor structure and a second semiconductor structure, according to some embodiments of the present disclosure.
Figure 11:
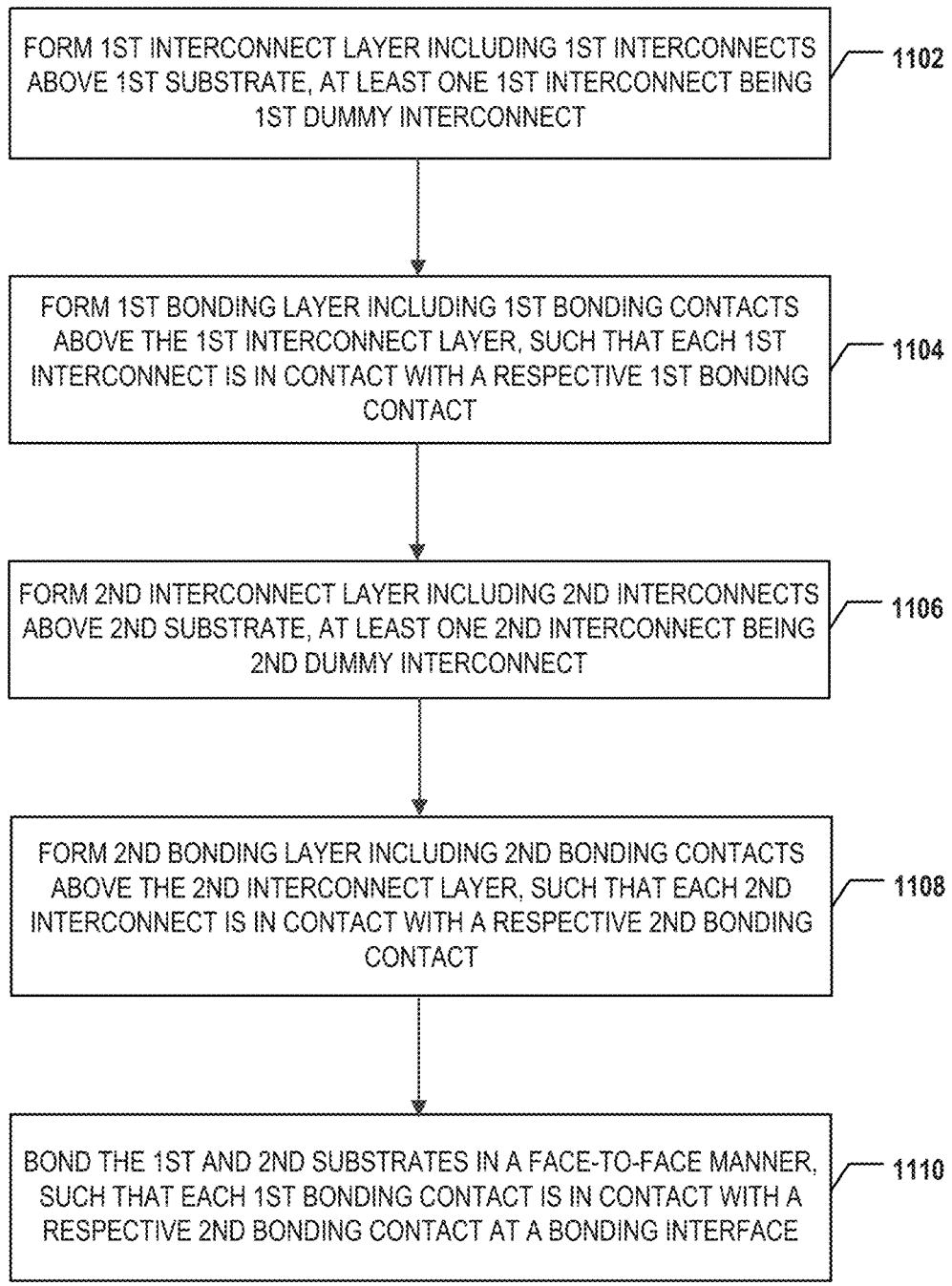
FIG. 11 is a flowchart of a method for forming an exemplary bonded semiconductor device including dummy bonding contacts and dummy interconnects, according to some embodiments of the present disclosure.

FIGS. 7A and 7B illustrate an exemplary fabrication process for forming a first semiconductor structure including dummy bonding contacts and dummy interconnects, according to some embodiments of the present disclosure. FIGS. 8A and 8B illustrate an exemplary fabrication process for forming a second semiconductor structure including dummy bonding contacts and dummy interconnects, according to some embodiments of the present disclosure. FIG. 9 illustrates another exemplary fabrication process for bonding the first semiconductor structure and the second semiconductor structure, according to some embodiments of the present disclosure. FIG. 11 is a flowchart of a method for forming an exemplary bonded semiconductor device including dummy bonding contacts and dummy interconnects, according to some embodiments of the present disclosure. Examples of the bonded semiconductor device depicted in FIGS. 7-9 and 11 include bonded structure 300 depicted in FIG. 3. FIGS. 7-9 and 11 will be described together. It is understood that the operations shown in method 1100 are not exhaustive and that other operations can be performed as well before, after, or between any of the illustrated operations. Further, some of the operations may be performed simultaneously, or in a different order than shown in FIGS. 7-9 and 11.

Referring to FIG. 11, method 1100 starts at operation 1102, in which a first interconnect layer including a plurality of first interconnects is formed above a first substrate. The first substrate can be a silicon substrate. At least one of the first interconnects can be at least one first dummy interconnect. In some embodiments, a first device layer is formed between the first substrate and the first interconnect layer prior to forming the first interconnect layer. The first device layer can include a NAND memory string or a peripheral device. The first dummy interconnect is not electrically connected to the NAND memory string and the peripheral device, according to some embodiments.

As illustrated in FIG. 7A, a first device layer 704 is formed above a silicon substrate 702. In some embodiments, first device layer 704 is a peripheral device layer including a plurality of transistors (not shown) formed on silicon substrate 702 by a plurality of processes including, but not limited to, photolithography, dry/wet etch, thin film deposition, thermal growth, implantation, CMP, and any other suitable processes. In some embodiments, first device layer 704 is a memory array device layer including a plurality of NAND memory strings (not shown) each extending vertically through a memory stack (not shown) formed on silicon substrate 702. The details of forming the memory array device layer are described above and will not be repeated.

As illustrated in FIG. 7A, a first interconnect layer 706 is formed above first device layer 704. First interconnect layer 706 can include functional interconnects 708 and dummy interconnects 710, including interconnect lines and via contacts in one or more ILD layers. Functional interconnects 708 make electrical connections with first device layer 704, while dummy interconnects 710 are not electrically connected to first device layer 704, according to some embodiments. In some embodiments, first interconnect layer 706 includes multiple ILD layers and interconnects therein formed by multiple processes. For example, interconnects 708 and 710 can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 1100 proceeds to operation 1104, as illustrated in FIG. 11, in which a first bonding layer including a plurality of first bonding contacts is formed above the first interconnect layer, such that each of the first interconnects is in contact with a respective one of the first bonding contacts. A first dielectric can be formed in the first bonding layer as well. In some embodiments, the first bonding contacts in the first bonding layers are formed by a single patterning process. In some embodiments, the number of the first bonding contacts is the same as the number of first interconnects. Each of the first bonding contacts has a nominally same critical dimension, according to some embodiments.

As illustrated in FIG. 7B, a layer of dielectric 711 is deposited on the top surface of first interconnect layer 706 by a thin film deposition process including, but not limited to, CVD, PVD, ALD, or any combination thereof. Functional bonding contacts 714 and dummy bonding contacts 716 are formed in dielectric 711 to form a first bonding layer 712 above first interconnect layer 706 and first device layer 704, according to some embodiments. Bonding contacts 714 and 716 can be patterned by a single patterning process involving only one photolithography process. In some embodiments, etch masks (photoresist and/or hard masks) are patterned by a single patterning process to expose dielectric 711 only at the areas where interconnects 708 and 710 are formed underneath. Opening (e.g., a via hole and/or a trench) then can be etched through first bonding layer 712 until being stopped by underneath interconnects 708 and 710 as etch stop layers using dry etch and/or wet etch. Bonding contacts 714 and 716 can include a barrier/adhesion layer and a conductor (e.g., a metal) deposited subsequently in this order by one or more thin film deposition processes including, but not limited to, CVD, PVD, ALD, electrochemical depositions, or any combination thereof, to fill the openings. The excess conductor can be removed by CMP, and the top surface of first bonding layer 712 can be planarized for bonding.

Method 1100 proceeds to operation 1106, as illustrated in FIG. 11, in which a second interconnect layer including a plurality of second interconnects is formed above a second substrate. The second substrate can be a silicon substrate. At least one of the second interconnects can be at least one second dummy interconnect. In some embodiments, a second device layer is formed between the second substrate and the second interconnect layer prior to forming the second interconnect layer. The second device layer can include a NAND memory string or a peripheral device. The second dummy interconnect is not electrically connected to the NAND memory string and the peripheral device, according to some embodiments.

As illustrated in FIG. 8A, a second device layer 804 is formed above a silicon substrate 802. In some embodiments, second device layer 804 is a peripheral device layer including a plurality of transistors (not shown) formed on silicon substrate 802 by a plurality of processes including, but not limited to, photolithography, dry/wet etch, thin film deposition, thermal growth, implantation, CMP, and any other suitable processes. In some embodiments, second device layer 804 is a memory array device layer including a plurality of NAND memory strings (not shown) each extending vertically through a memory stack (not shown) formed on silicon substrate 802. The details of forming the memory array device layer are described above and will not be repeated.

As illustrated in FIG. 8A, a second interconnect layer 806 is formed above second device layer 804. Second interconnect layer 806 can include functional interconnects 808 and dummy interconnects 810, including interconnect lines and via contacts in one or more ILD layers. Functional interconnects 808 make electrical connections with second device layer 804, while dummy interconnects 810 are not electrically connected to second device layer 804, according to some embodiments. In some embodiments, second interconnect layer 806 includes multiple ILD layers and interconnects therein formed by multiple processes. For example, interconnects 808 and 810 can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 1100 proceeds to operation 1108, as illustrated in FIG. 11, in which a second bonding layer including a plurality of second bonding contacts is formed above the second interconnect layer, such that each of the second interconnects is in contact with a respective one of the second bonding contacts. A second dielectric can be formed in the second bonding layer as well. In some embodiments, the second bonding contacts in the second bonding layers are formed by a single patterning process. In some embodiments, the number of the second bonding contacts is the same as the number of the second interconnects. Each of the second bonding contacts has a nominally same critical dimension, according to some embodiments. In some embodiments, the number of the second bonding contacts is the same as the number of the first bonding contacts.

As illustrated in FIG. 8B, a layer of dielectric 811 is deposited on the top surface of second interconnect layer 806 by a thin film deposition process including, but not limited to, CVD, PVD, ALD, or any combination thereof. Functional bonding contacts 814 and dummy bonding contacts 816 are formed in dielectric 811 to form a second bonding layer 812 above second interconnect layer 806 and second device layer 804, according to some embodiments. Bonding contacts 814 and 816 can be patterned by a single patterning process involving only one photolithography process. In some embodiments, etch masks (photoresist and/or hard masks) are patterned by a single patterning process to expose dielectric 811 only at the areas where interconnects 808 and 810 are formed underneath. Opening (e.g., a via hole and/or a trench) then can be etched through second bonding layer 812 until being stopped by underneath interconnects 808 and 810 as etch stop layers using dry etch and/or wet etch. Bonding contacts 814 and 816 can include a barrier/adhesion layer and a conductor (e.g., a metal) deposited subsequently in this order by one or more thin film deposition processes including, but not limited to, CVD, PVD, ALD, electrochemical depositions, or any combination thereof, to fill the openings. The excess conductor can be removed by CMP, and the top surface of second bonding layer 812 can be planarized for bonding.

Method 1100 proceeds to operation 1110, as illustrated in FIG. 11, in which the first substrate and the second substrate are bonded in a face-to-face manner, such that each of the first bonding contacts is in contact with a respective one of the second bonding contacts at a bonding interface. The first dielectric can be in contact with the second dielectric as well after the bonding. The bonding can be hybrid bonding.

As illustrated in FIG. 9, silicon substrate 702 and first device layer 704 formed thereon are flipped upside down. First bonding layer 712 facing down is to be bonded with second bonding layer 812 facing up, i.e., in a face-to-face manner. In some embodiments, bonding contacts 714 and 716 are aligned with bonding contacts 814 and 816 prior to hybrid bonding, such that each bonding contact 714 or 716 is in contact with corresponding bonding contact 814 or 816 at a bonding interface after the hybrid bonding, according to some embodiments. In some embodiments, a treatment process, e.g., a plasma treatment, a wet treatment, and/or a thermal treatment, is applied to the bonding surfaces prior to the hybrid bonding. As a result of the hybrid bonding, bonding contacts 714 and 716 can be inter-mixed with bonding contacts 814 and 816, and dielectric 711 can be covalent-bonded with dielectric 811, thereby forming a bonding interface between first bonding layer 712 and second bonding layer 812.

According to one aspect of the present disclosure, a semiconductor device includes a first semiconductor structure and a second semiconductor structure. The first semiconductor structure includes a first interconnect layer including a plurality of first interconnects. The first semiconductor structure further includes a first bonding layer including a plurality of first bonding contacts. Each of the first interconnects is in contact with a respective one of the first bonding contacts. The second semiconductor structure includes a second interconnect layer including a plurality of second interconnects. The second semiconductor structure further includes a second bonding layer including a plurality of second bonding contacts. At least one of the second bonding contacts is in contact with a respective one of the second interconnects. At least another one of the second bonding contacts is separated from the second interconnects. The semiconductor device further includes a bonding interface between the first bonding layer and the second bonding layer. Each of the first bonding contacts is in contact with one of the second bonding contacts at the bonding interface.

In some embodiments, a number of the first bonding contacts is the same as a number of the first interconnects. In some embodiments, the number of the first bonding contacts is smaller than a number of the second bonding contacts.

In some embodiments, each of the first bonding contacts has a nominally same critical dimension.

In some embodiments, the first and second bonding contacts include a pair of bonding contacts in contact with one another at the bonding interface, and the pair of bonding contacts electrically connect a respective pair of the first and second interconnects. In some embodiments, the first and second bonding contacts include a pair of dummy bonding contacts in contact with one another at the bonding interface, and the pair of dummy bonding contacts are electrically connected to a respective first interconnect but not a second interconnect.

In some embodiments, at least one of the second bonding contacts is separated from the first bonding contacts at the bonding interface.

In some embodiments, at least one of the second bonding contacts includes a first portion having a first critical dimension and a second portion having a second critical dimension different from the first critical dimension.

In some embodiments, the first bonding layer further includes a first dielectric, and the second bonding layer further includes a second dielectric in contact with the first dielectric at the bonding interface.

In some embodiments, one of the first semiconductor structure and the second semiconductor structure further includes a device layer having a NAND memory string, and another one of the first semiconductor structure and the second semiconductor structure further includes a device layer having a peripheral device.

According to another aspect of the present disclosure, a bonded structure includes a bonding interface, a pair of functional bonding contacts, and a pair of dummy bonding contacts. The pair of functional bonding contacts are in contact with one another at the bonding interface. The pair of functional bonding contacts are in contact with a pair of interconnects on opposite sides of the bonding interface, respectively. The pair of dummy bonding contacts are in contact with one another at the bonding interface. The pair of dummy bonding contacts are in contact with an interconnect on one side of the bonding interface and separated from any interconnect on the opposite side of the bonding interface.

In some embodiments, the bonded structure further includes a pair of dielectrics in contact with one another at the bonding interface. In some embodiments, the bonded structure further includes another dummy bonding contact at the bonding interface and separated from any interconnect on either side of the bonding interface.

According to still another aspect of the present disclosure, a method for forming a semiconductor device is disclosed. A first interconnect layer including a plurality of first interconnects is formed above a first substrate. A first bonding layer including a plurality of first bonding contacts is formed above the first interconnect layer, such that each of the first interconnects is in contact with a respective one of the first bonding contacts. A second interconnect layer including a plurality of second interconnects is formed above a second substrate. A second bonding layer including a plurality of second bonding contacts is formed above the second interconnect layer, such that at least one of the second bonding contacts is in contact with a respective one of the second interconnects, and at least another one of the second bonding contacts is separated from the second interconnects. The first substrate and the second substrate are bonded in a face-to-face manner, such that each of the first bonding contacts is in contact with one of the second bonding contacts at a bonding interface.

In some embodiments, to form the first bonding layer, the first bonding contacts are formed by a single patterning process. In some embodiments, to form the second bonding layer, the second bonding contacts are formed by two patterning processes.

In some embodiments, to form the second bonding layer, first portions of second bonding contacts are formed above the second interconnects by one of the two patterning processes, and second portions of second bonding contacts are formed above the first portions of second bonding contacts by another one of the two patterning processes. A number of the second portions of second bonding contacts is greater than a number of the first portions of second bonding contacts, according to some embodiments.

In some embodiments, a number of the first bonding contacts is the same as a number of the first interconnects.

In some embodiments, each of the first bonding contacts has a nominally same critical dimension.

In some embodiments, to form the first bonding layer, a first dielectric is formed in the first bonding layer. In some embodiments, to form the second bonding layer, a second dielectric is formed in the second bonding layer. The first dielectric is in contact with the second dielectric at the bonding interface after the bonding, according to some embodiments.

In some embodiments, a first device layer having a NAND memory string is formed between the first interconnect layer and the first substrate, and a second device layer having a peripheral device between the second interconnect layer and the second substrate.

In some embodiments, a first device layer having a peripheral device is formed between the first interconnect layer and the first substrate, and a second device layer having a NAND memory string between the second interconnect layer and the second substrate.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor device, comprising:
    forming a first interconnect layer comprising a plurality of first interconnects above a first substrate;
    forming a first bonding layer comprising a plurality of first bonding contacts above the first interconnect layer, such that each of the first interconnects is in contact with a respective one of the first bonding contacts;
    forming a second interconnect layer comprising a plurality of second interconnects above a second substrate;
    forming a second bonding layer comprising a plurality of second bonding contacts above the second interconnect layer, such that at least one of the second bonding contacts is in contact with a respective one of the second interconnects, and at least another one of the second bonding contacts is separated from the second interconnects; and
    bonding the first substrate and the second substrate in a face-to-face manner, such that each of the first bonding contacts is in contact with one of the second bonding contacts at a bonding interface.

2. The method of claim 1, wherein forming the first bonding layer comprises forming the first bonding contacts by a single patterning process.

3. The method of claim 1, wherein forming the second bonding layer comprises forming the second bonding contacts by two patterning processes.

4. The method of claim 1, wherein forming the second bonding layer comprises:
    forming first portions of second bonding contacts above the second interconnects by one of the two patterning processes; and
    forming second portions of second bonding contacts above the first portions of second bonding contacts by another one of the two patterning processes, wherein a number of the second portions of second bonding contacts is greater than a number of the first portions of second bonding contacts.

5. The method of claim 1, wherein a number of the first bonding contacts is the same as a number of the first interconnects.

6. The method of claim 1, wherein each of the first bonding contacts has a nominally same critical dimension.

7. The method of claim 1, wherein:
    forming the first bonding layer comprises forming a first dielectric in the first bonding layer;
    forming the second bonding layer comprises forming a second dielectric in the second bonding layer; and
    the first dielectric is in contact with the second dielectric at the bonding interface after the bonding.

8. The method of claim 1, further comprising:
    forming a first device layer having a NAND memory string between the first interconnect layer and the first substrate; and
    forming a second device layer having a peripheral device between the second interconnect layer and the second substrate.

9. The method of claim 1, further comprising:
    forming a first device layer having a peripheral device between the first interconnect layer and the first substrate; and
    forming a second device layer having a NAND memory string between the second interconnect layer and the second substrate.

10. The method of claim 1, wherein the bonding comprises hybrid bonding.

* * * * *